(12) United States Patent
Ramkaj et al.

(10) Patent No.: US 12,525,979 B2
(45) Date of Patent: Jan. 13, 2026

(54) BOOTSTRAPPED SWITCH

(71) Applicant: TEXAS INSTRUMENTS INCORPORATED, Dallas, TX (US)

(72) Inventors: Athanasios Ramkaj, Mountain View, CA (US); Michael H. Perrott, Nashua, NH (US); Baher S. Haroun, Allen, TX (US); Boris Murmann, Honolulu, HI (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 21 days.

(21) Appl. No.: 18/296,649

(22) Filed: Apr. 6, 2023

(65) Prior Publication Data

US 2024/0146306 A1 May 2, 2024

Related U.S. Application Data

(60) Provisional application No. 63/420,766, filed on Oct. 31, 2022.

(51) Int. Cl.
*H03K 19/0185* (2006.01)
*H03K 3/356* (2006.01)

(52) U.S. Cl.
CPC .......... *H03K 19/018521* (2013.01); *H03K 3/356113* (2013.01)

(58) Field of Classification Search
None
See application file for complete search history.

(56) References Cited

U.S. PATENT DOCUMENTS

| | | | |
|---|---|---|---|
| 9,013,339 B2* | 4/2015 | Payne | H03M 1/08 341/123 |
| 11,942,942 B1* | 3/2024 | Chan | H01L 29/1045 |
| 12,155,377 B2* | 11/2024 | Niikura | H03K 3/356113 |
| 2022/0216861 A1* | 7/2022 | Singer | H03K 17/04123 |

OTHER PUBLICATIONS

Abo, A., "Design for Reliability of Low-Voltage, Switched-capacitor Circuits," PHD Thesis, UC Berkeley, 1999.
Ali, et al., "A 14-bit 125 MS/s IF/RF Sampling Pipelined ADC with 100 dB SFDR and 50 fs Jitter," IEEE J. of Solid State Circuits, vol. 41, No. 8, pp. 1846-1855, Aug. 2006.
Payne, et al., "A 16-Bit 100 to 160 MS/s SiGe BiCMOS Pipelined ADC with 100 dBFS SFDR," IEEE Journal of Solid-State Circuits, vol. 45, No. 12, pp. 2613-2622, Dec. 2010.
Ali, et al., "A 14 Bit 1 GS/s RF sampling pipelined ADC with background calibration," IEEE J. Solid-State Circuits (JSSC), vol. 45, No. 12, pp. 2857-2867, Dec. 2014.

(Continued)

*Primary Examiner* — Cassandra F Cox
(74) *Attorney, Agent, or Firm* — Frank D. Cimino

(57) ABSTRACT

An apparatus includes: buffer circuitry having a buffer input and a buffer output; a transistor coupled between the buffer output and a current terminal, the transistor having a control terminal; and level shifter circuitry having a level shifter input and a level shifter output, the level shifter input coupled to the buffer input, and the level shifter output coupled to the control terminal.

24 Claims, 25 Drawing Sheets

(56) References Cited

OTHER PUBLICATIONS

Ali, et al., "A 12-b 18-GS/s RF Sampling ADC with an Integrated Wideband Track-and-Hold Amplifier and Background Calibration," IEEE J. Solid-State Circuits (JSSC), vol. 55, No. 12, pp. 3210-3224, Dec. 2020.
Devarajan, et al., "A 12-b 10-GS/s Interleaved Pipeline ADC in 28-nm CMOS Technology," IEEE J. Solid-State Circuits (JSSC), vol. 52, No. 12, pp. 3204-3218, Dec. 2017.
Ramkaj, et al., "A 5-GS/s 158.6-mW 9.4-ENOB Passive-Sampling Time-Interleaved Three-Stage Pipelined-SAR ADC with Analog-Digital Corrections in 28-nm CMOS," IEEE J. Solid-State Circuits (JSSC), vol. 55, No. 6, pp. 1553-1564, Jun. 2020.
Pelgrom, M.J.M, "Analog-to-Digital Conversion," ch. 8, pp. 381-395, 4th ed., Springer, 2022.

\* cited by examiner

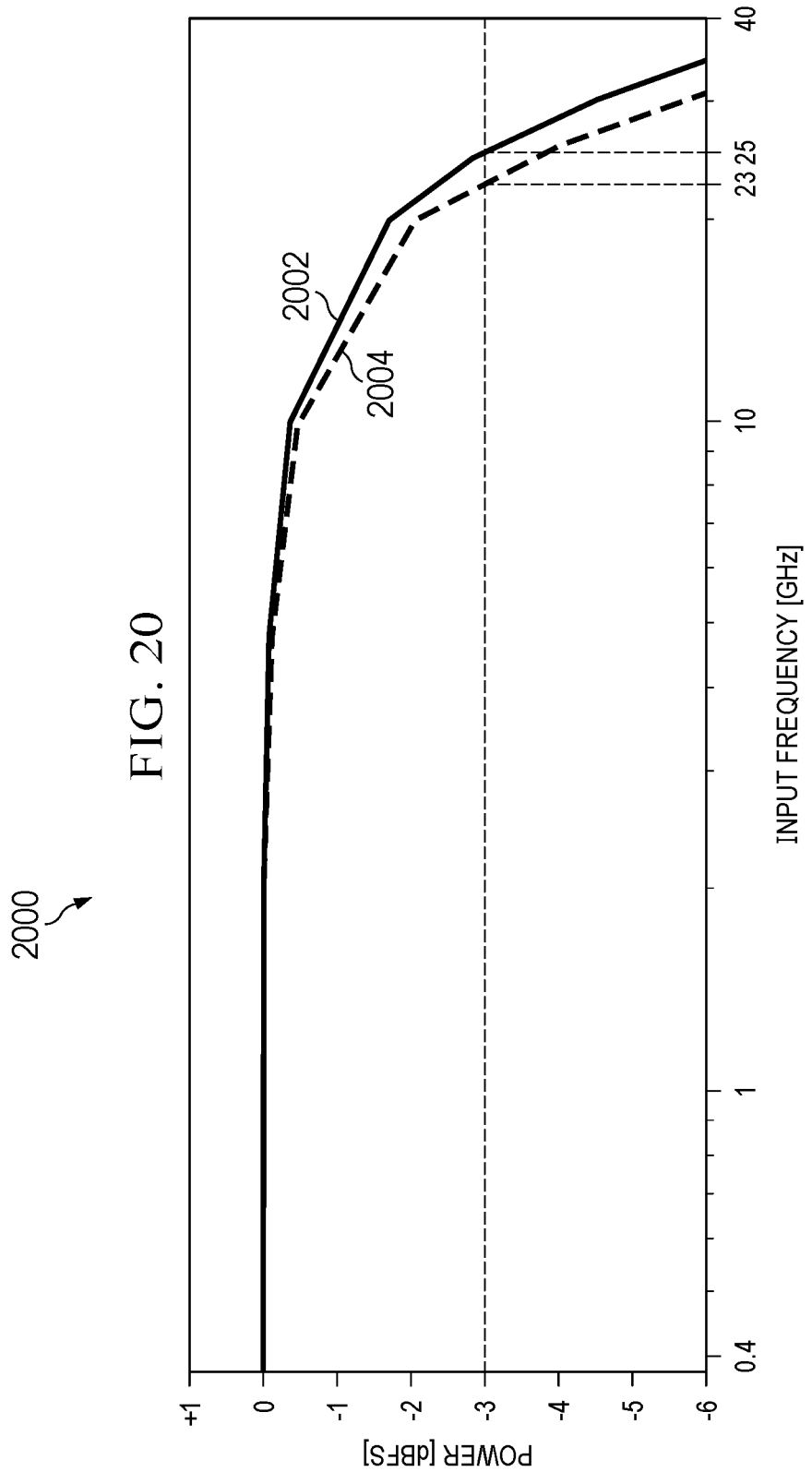

BOOTSTRAPPED SWITCH

CROSS REFERENCE TO RELATED APPLICATION

The present application is related to: U.S. Provisional Application No. 63/420,766, titled "Heterogeneous SiGe and CMOS Approach for Multi-Way Sample-and-Hold (S&H) Front End", filed on Oct. 31, 2022, which is hereby incorporated by reference in its entirety.

BACKGROUND

Many integrated circuits (ICS) use switches to control acquisition and movement of signal. For example, a switch may be used for sampling a signal and can be part of a sample and hold (S/H) circuit. As another example, a switch may be controllable to enable/disable flow of a signal between an input and an output and can be part of a multiplexer or a demultiplexer. In both examples, it is desirable for the switch to have a high bandwidth, and to have a high linearity over a wide signal amplitude range.

SUMMARY

In an example, an apparatus includes: buffer circuitry having a buffer input and a buffer output; a transistor coupled between the buffer output and a current terminal, the transistor having a control terminal; and level shifter circuitry having a level shifter input and a level shifter output, the level shifter input coupled to the buffer input, and the level shifter output coupled to the control terminal.

In another example, an apparatus includes: buffer circuitry having a buffer input and a buffer output; a transistor coupled between the buffer output and a current terminal, the transistor having a control terminal; and level shifter circuitry having a level shifter input and a level shifter output, the level shifter input fixedly coupled to the buffer output, and the level shifter output coupled to the control terminal.

BRIEF DESCRIPTION OF THE DRAWINGS

FIGS. 20, 21A, 21B, 22A, and 22B are graphs representing properties of example circuits including buffer circuit and a bootstrapped switch described in FIGS. 3-19.

DETAILED DESCRIPTION

Figure 1:
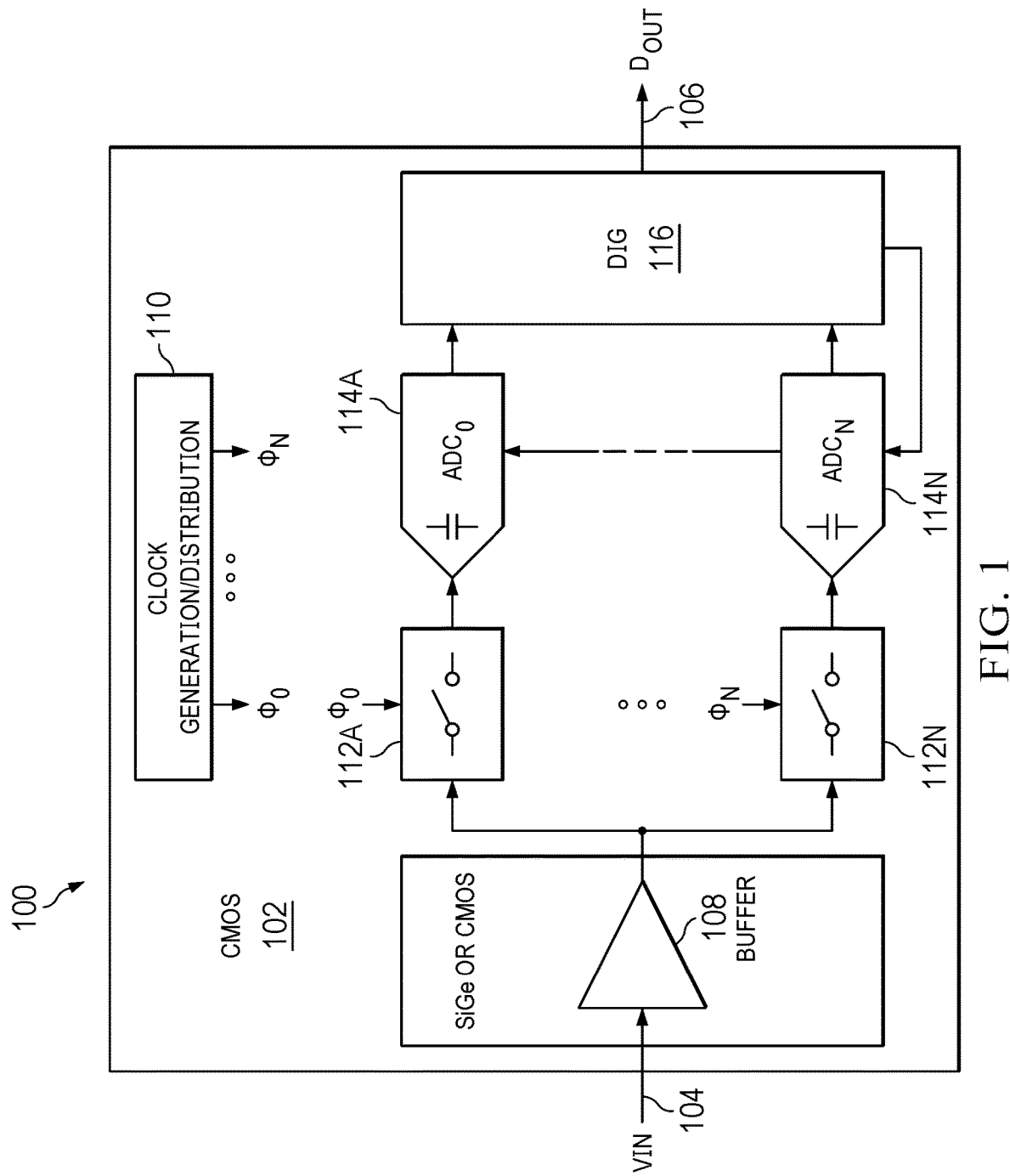
FIG. 1 is a schematic diagram illustrating an analog-to-digital converter (ADC) including examples of bootstrapped switches described herein.

The same reference numbers or other reference designators are used in the drawings to designate the same or similar features. Such features may be the same or similar either by function and/or structure.

FIG. 1 is a schematic diagram showing an example analog-to-digital converter (ADC) 100. As shown, the ADC 100 is based on an integrated circuit (IC) 102. In some examples, IC 102 is fabricated using a complementary metal-oxide semiconductor (CMOS) process. In other examples, the IC may be fabricated using a silicon germanium (SiGe) process. In other examples, the IC may be fabricated using both CMOS and SiGe processes. In other examples, the ADC 100 is formed by multiple ICS, where each IC is fabricated using a different process such as a CMOS process, a SiGe process, a bipolar complementary metal-oxide semiconductor (BiCMOS) process, or combinations thereof.

As shown, the ADC 100 has an input 104 and an output 106. The ADC 100 includes a buffer 108, switches 112A to 112N, ADC sampler elements 114A to 114N, a digitizer 116, and a clock generator 110. Each of the buffer 108, the switches 112A to 112N, and the ADC sampler elements 114A to 114N has a respective input and a respective output. Each of the ADC sampler elements 114A to 114N also has a respective control terminal. The digitizer 116 has an output and a respective input for each of the ADC sampler elements 114A to 114N. The clock generator 110 has outputs coupled to respective control terminals of the ADC sampler elements 114A to 114N.

In operation, the ADC 100 is configured to: receive an input voltage (VIN) at its input 104; buffer VIN using the buffer 108; provide buffered VIN to the ADC sampler elements 114A to 114N via the switches 112A to 112N, where the switches 112A to 112N are controlled by differently-phased clock signals $\Phi_0$ to $\Phi_N$ provided by the clock generator 110; sample the buffered VIN using the ADC sampler elements 114A to 114N; use the digitizer 116 to digitize the VIN samples provided by the ADC sampler elements 114A to 114N; and output digital codes ($D_{OUT}$) responsive to the digitized VIN samples. Each of ADC sampler elements 114A to 114N may include a respective capacitor, and each of switches 112A to 112N and the respective capacitor may form a sample and hold (S/H) circuit. In some examples, the switches 112A to 112N are bootstrapped switches, where the clock signals $\Phi_0$ to $\Phi_N$ are bootstrapped based on VIN. As described herein, switches 112A to 112N may include bootstrapped switches, where the control signals of switches 112A to 112N are generated by bootstrapping clock signals $\Phi_0$ to $\Phi_N$ based on VIN during the sampling phase when the switches are enabled. The bootstrapping of the clock signals can improve the linearity and bandwidth of the S/H circuits.

Figure 2:
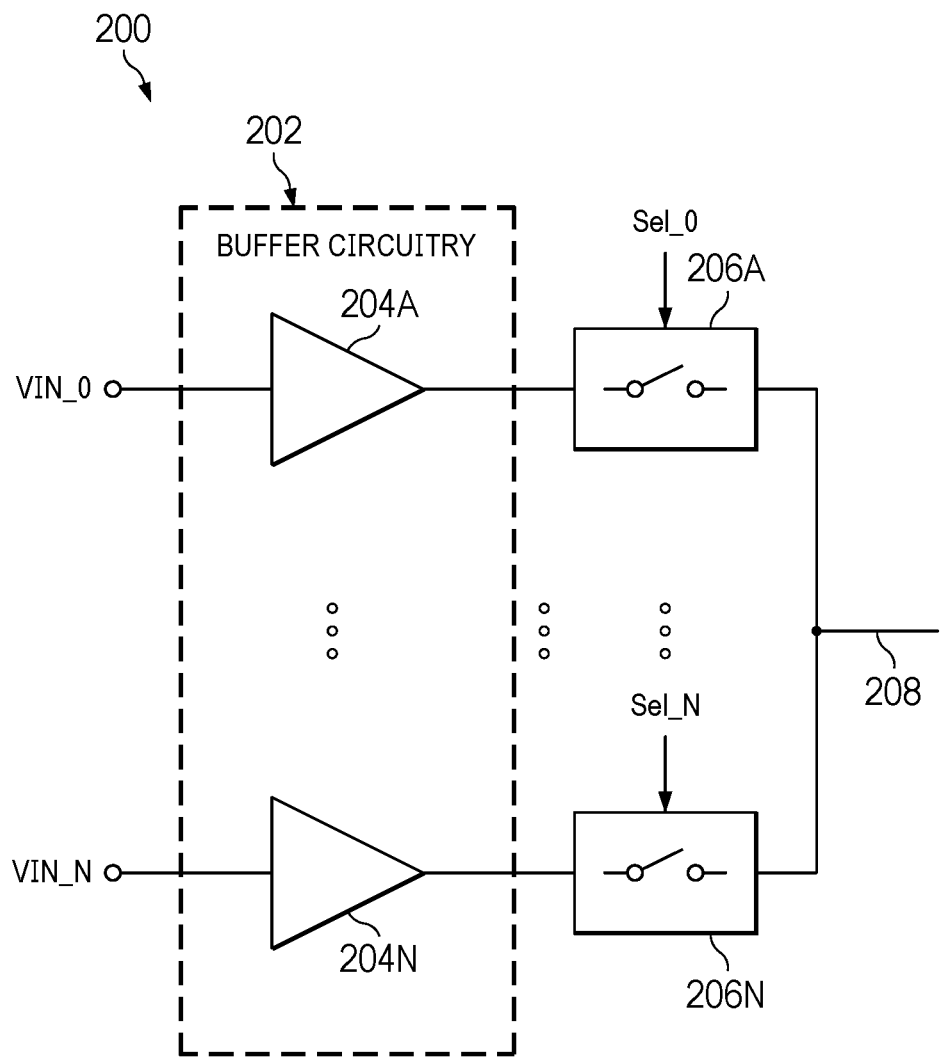
FIG. 2 is a schematic diagram illustrating a multiplexer including examples of bootstrapped switches described herein.

FIG. 2 is a schematic diagram showing an example multiplexer circuit 200. In the example of FIG. 2, the multiplexer circuit 200 includes buffer circuitry 202 and switches 206A to 206N. The buffer circuitry 202 has a plurality of inputs and outputs, and includes buffers 204A to 204N. Each of buffers 204A to 204N has: an input coupled to a respective input of the buffer circuitry 202; and an output coupled to a respective output of the buffer circuitry 202. Each of the switches 206A to 206N has a first terminal, a second terminal, and a control terminal. Each first terminal of the switches 206A to 206N is coupled to a respective output of the buffer circuitry 202. Each second terminal of the switches 206A to 206N is coupled to an output terminal 208 of the circuit 200. Each control terminal of the switches 206A to 206N receives a respective control signal based on the control signals Sel_0 to Sel_N. In some examples, the circuit 200 is configured to: buffer input voltages (VIN_0 to VIN_N) received by the buffer circuitry 202 using the buffers 204A to 204N; and selectively provide buffered versions of VIN_0 to VIN_N to the output terminal 208 responsive to the operations of the switches 206A to 206N. The switches 206A to 206N are operated responsive to the control signals Sel_0 to Sel_N. In some examples, the switches 206A to 206N are bootstrapped switches, where the control signals to one of the switches 206A to 206N can be generated by bootstrapping of the control signals Sel_0 to Sel_N based on one of the voltages VIN_0 to VIN_N, to enable a particular switch to selectively transmit one of the voltages VIN_0 to VIN_N. Such arrangements can improve the linearity and bandwidth of the multiplexer circuit 200 in transmitting the selected voltage.

In some examples, the multiplexer circuit 200 can be a part of ADC circuitry of an IC such as the ADC 100 of FIG. 1. In other examples, the multiplexer circuit 200 is part of other circuitry of an IC. In some examples, the components of the circuit 200 are distributed on separate dies. For example, buffer circuitry 202 may be part of a first die, while the switches 206A to 206N are part of a second die. The first and second dies may be CMOS dies, SiGe dies, BiCMOS dies, or other IC options. In other examples, the components of the circuit 200 are on a single die such as a CMOS die, a SiGe die, a BiCMOS die, or other IC options.

Figure 3:
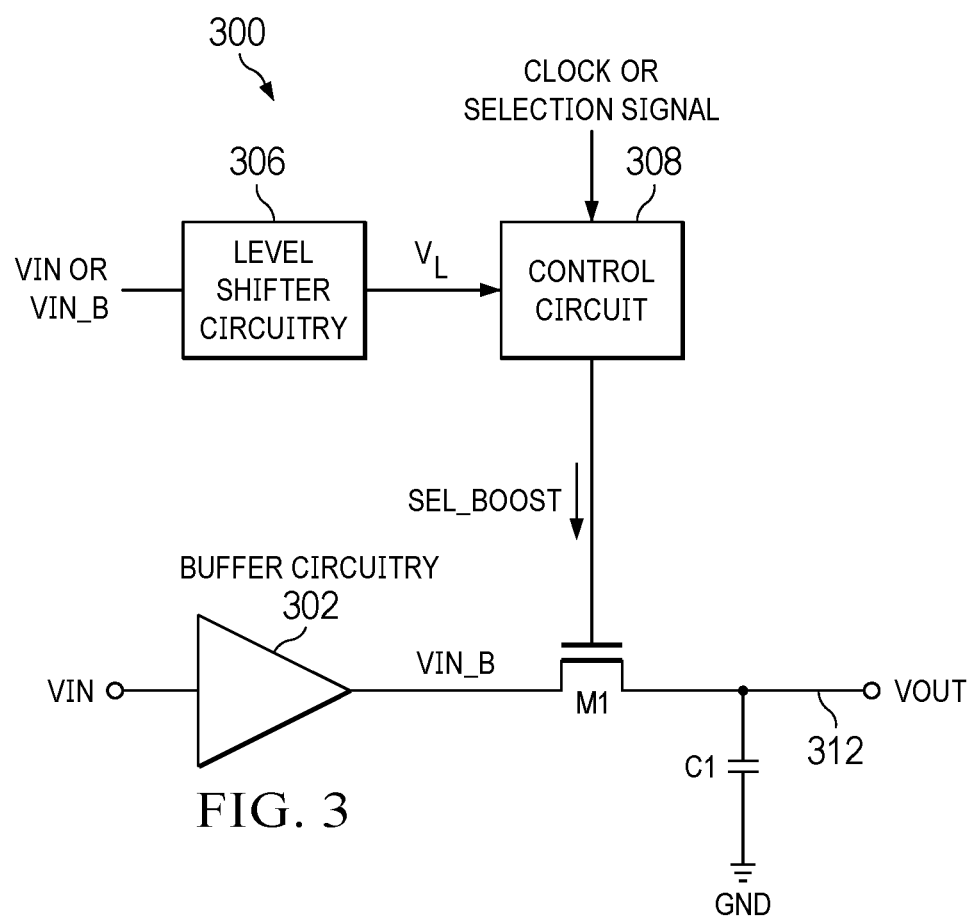
FIG. 3 is a schematic diagram illustrating an example circuit including buffer circuitry and a bootstrapped switch.

FIG. 3 illustrates example of a circuit 300 including a bootstrapped switch. The circuit 300 can be part of ADC 100 of FIG. 1 and multiplexer circuit 200 of FIG. 2. In the example of FIG. 3, the circuit 300 includes buffer circuitry 302, level shifter circuitry 306, control circuit 308, a transistor M1, a capacitor C1, and a current terminal 312. The circuit 300 also includes a ground terminal. As shown, the buffer circuitry 302 has an input and an output. The buffer circuitry 302 can receive a voltage VIN, and provide a voltage VIN_B as a buffered version of VIN. The transistor M1 has a first current terminal, a second current terminal, and a control terminal. The first current terminal of the transistor M1 is coupled to the output of the buffer circuitry 302, and the second current terminal of the transistor M1 is coupled to the current terminal 312. The control circuit 308 has an input terminal, a control terminal, and an output. The control circuit 308 can receive a clock signal or a selection signal at the control terminal. The input terminal of the control circuit 308 is coupled to the output of the level shifter circuitry 306. The output terminal of the control circuit 308 is coupled to the control terminal of the transistor M1.

The level shifter circuitry 306 also has an input. In some examples, the input of the level shifter circuitry 306 can be fixedly or directly coupled to the input or the output of the buffer circuitry 302. For example, the input of the level shifter circuitry 306 is not coupled to the input or the output of the buffer circuitry 302 via a switch. As another example, the input of the level shifter circuitry 306 is not disconnected from the input or the output of the buffer circuitry 302 according to a state of the selection signal received by the control circuit 308. The output of the level shifter circuitry 306 is coupled to the input terminal of the control circuit 308 to provide a voltage $V_L$ that is a level-shifted version of VIN or VIN_B. If the clock/selection signal has a high state (e.g., a logical one), control circuit 308 can provide a control signal SEL_BOOST that tracks $V_L$, which represents a bootstrapped version of the selection signal. If the clock/selection signal has a low state (e.g., a logical one), control circuit 308 can provide control signal SEL_BOOST as a ground voltage (e.g., 0V), at the control terminal of the transistor M1. The transistor M1 can be enabled by the control signal SEL_BOOST tracking $V_L$ and transmit VIN_B to the current terminal 312. Alternatively, the transistor M1 can be disabled by the control signal SEL_BOOST being 0V and disconnect the current terminal 312 from the first current terminal of the transistor M1. Also, the capacitor C1 has a first side and a second side. Circuit 300 can include capacitor C1 in a case where circuit 300 is part of an S/H circuit (e.g., of ADC 100). In examples where circuit 300 is part of a multiplexer circuit (e.g., multiplexer circuit 200 of FIG. 2), the capacitor C1 can be omitted, or the capacitor C1 can represent the parasitic capacitance of another circuit coupled to the output of the multiplexer circuit (e.g., a transistor). In the example of FIG. 3, the second side of the capacitor C1 is coupled to the ground terminal, and the current terminal 312 (and the first side of the capacitor C1) can provide a voltage VOUT that tracks the current state of VIN_B if the transistor M1 is enabled or represents the last state of VIN_B before the transistor M1 is enabled. In some examples, as to be described in FIG. 9, capacitor C1 is coupled between the current terminal 312 and an output terminal to support bottom-plate sampling, and the output terminal can provide the voltage VOUT. The output of the level shifter circuitry 306 is coupled to the input of the control circuit 308. The output of the control circuit 308 is coupled to the control terminal of the transistor M1.

In operation, the buffer circuitry 302 is configured to: receive VIN at its input; provide a buffered signal (VIN_B) at its output responsive to VIN. The level shifter circuitry 306 is configured to: receive VIN or VIN_B at its input; and provide a level shifted signal ($V_L$) at its output responsive to VIN or VIN_B. The control circuit 308 is configured to: receive $V_L$ at its input; receive a clock signal or a selection signal at its control terminal; and provide a control signal (SEL_BOOST) at its output responsive to $V_L$ and the clock signal or the selection signal. M1 is configured to pass VIN_B to the current terminal 312 responsive to SEL_BOOST. C1 is charged responsive to VIN_B such that VIN_B is available at the output terminal 312 for use by other components of the circuit 300. In some examples, as to be described below, level shifter circuitry 306 can also be part of buffer circuitry, where the buffer circuitry provide both buffering and level shifting of VIN or VIN_B to generate $V_L$.

In some examples, the circuit 300 is a part of ADC circuitry of an IC such as the ADC 100 of FIG. 1. In some examples, the components of the circuit 300 are distributed on separate dies. For example, the buffer circuitry 302 and the level shifter circuitry 306 may be part of a first die, while the transistor M1 and the control circuit 308 are part of a second die. The capacitor C1 may be part of the second die or may be an external component. The first and second dies may be CMOS dies, SiGe dies, BiCMOS dies, or other IC options. In other examples, the components of the circuit 300 are on a single die such as a CMOS die, a SiGe die, a BiCMOS die, or other IC options.

Figure 4:
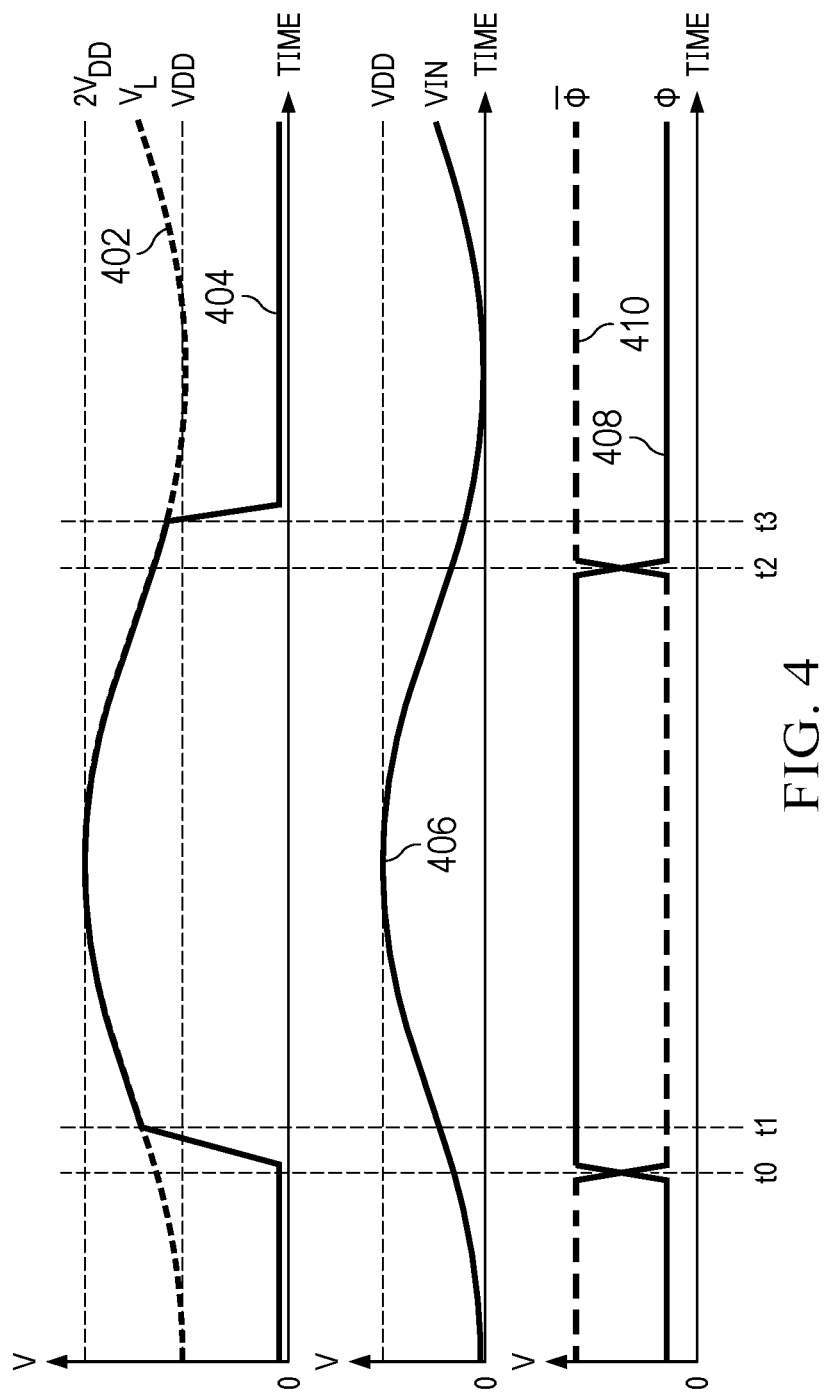
FIG. 4 includes graphs representing example operations of the circuit of FIG. 3.

FIG. 4 includes graphs 402, 404, 406, 408 and 410 illustrating example operations of the circuit of FIG. 3. Graph 402 represents example time-variations of $V_L$ at the output of the level shifter circuitry 306. Graph 404 represents example time-variations of the SEL_BOOST control signal. Graph 406 represents example time-variations of VIN at the input of the level shifter circuitry 306. Graph 408 represents example time-variations of a control signal (labelled Φ in FIG. 4) which can be the clock signal or the selection signal in FIG. 3, and graph 410 represents an inverted version of the control signal ($\overline{\Phi}$). In a case where circuit 300 is part of a S/H circuit, the duration in which Φ is at the high state can be a sampling/tracking phase. In a case where circuit 300 is part of a multiplexor circuit, Φ having the high state can represent that VIN is selected to be transmitted.

Referring to FIG. 4, the level shifter circuitry 306 can provide $V_L$ as a level shifted version of VIN, where $V_L=VIN+V_{DD}$. In the example of FIG. 4, VIN varies between 0 and $V_{DD}$, and $V_L$ varies between $V_{DD}$ and $2V_{DD}$. Also, before time t0, Φ is in a low state, and $\overline{\Phi}$ is in a high state. Switch SW1 is disabled, and switch SW2 is enabled, which sets the SEL_BOOST control signal to the ground voltage (0V). At time t0, the control signal Φ transitions to the high state. After a delay, starting at time t1, switch SW1 is fully enabled and SW2 is fully disabled, which sets the SEL_BOOST control signal to follow $V_L$. At time t1, the control signal Φ transitions to the low state. After a delay, starting at time t3, switch SW1 is fully disabled and SW2 is fully enabled, which sets the SEL_BOOST control signal back to the ground voltage.

By having SEL_BOOST track a level-shifted version of VIN, the gate-source (or gate-drain) voltage of the switch M1 can vary less with VIN when the switch M1 is turned on, which reduces the variation of the on-resistance of the switch M1 with VIN and improve the overall linearity of circuit 300. Also, the level shifter circuitry 306 can include high bandwidth circuitry to generate $V_L$, which can also improve the overall bandwidth of circuit 300.

Figure 5:
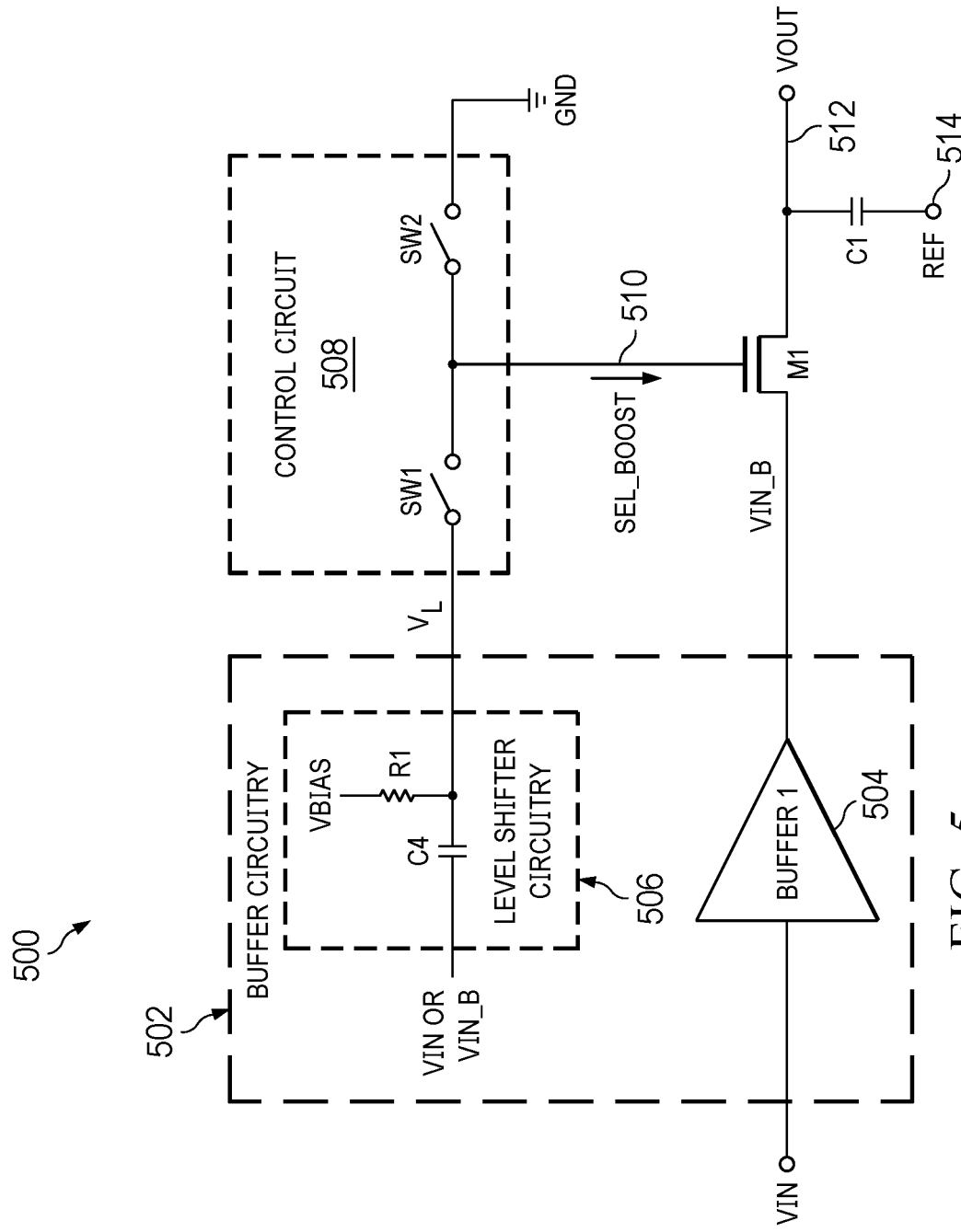
FIGS. 5-8 are schematic diagrams illustrating example components of the circuit of FIG. 3.

FIGS. 5-8 are schematic diagrams illustrating example components of FIG. 3. In the example of FIG. 5, the circuit 500 includes buffer circuitry 502, control circuit 508, the transistor M1, the capacitor C1, an output terminal 512, a reference terminal 514, and a ground terminal. As shown, the buffer circuitry 502 has an input, a first output, and a second output. The buffer circuitry 502 includes a buffer 504 and level shifter circuitry 506. Buffer 504 can be an example of buffer circuitry 302 of FIG. 3, level shifter circuitry 506 can be an example of level shifter circuitry 306 of FIG. 3, and control circuit 508 can be an example of control circuit 308 of FIG. 3. The level shifter circuitry 506 has an input and an output. In some examples, the level shifter circuitry 506 includes a resistor R1 and a capacitor C4. Each of the resistor R1 and the capacitor C4 has a first side and a second side. The transistor M1 has the first terminal, the second terminal, and the control terminal. The capacitor C1 has a first side and a second side. The resistor R1 and the capacitor C4 can be configured to provide high pass filtering, so that the level shifter circuitry 506 can have a high bandwidth or at least have high pass characteristics, and can generate a high frequency $V_L$ voltage signal from high frequency VIN or VIN_B voltage signals with minimum or reduced attenuation. Also, resistor R1 and capacitor C4 are passive components having high linearity and do not distort $V_L$ when VIN or VIN_B have high amplitudes. These features allow the level shifter circuitry 506 to have a high bandwidth and a high linearity in providing $V_L$ by level shifting VIN or VIN_B.

In some examples, the input of the buffer 504 is coupled to the input of the buffer circuitry 502 to receive VIN. The output of the buffer 504 is coupled to the first output of the buffer circuitry 502 to provide VIN_B. The input of the level shifter circuitry 506 is coupled to the input or output of the buffer 504. The output of the level shifter circuitry 506 is coupled to the second output of the buffer circuitry 502 to provide $V_L$ by level-shifting VIN or VIN_B. In some examples, the first side of the capacitor C4 is coupled to the input of the level shifter circuitry 506. The second side of the capacitor C4 is coupled to the output of the level shifter circuitry 506. The first side of the resistor R1 is coupled to a bias terminal, which is coupled to a bias voltage (VBIAS) source. The second side of the resistor R2 is coupled to the output of the level shifter circuitry 506. The VBIAS source can provide, for example, the $V_{DD}$ voltage of FIG. 4. To perform level shifting, capacitor C4 can store charge representing a voltage difference of $V_{DD}$ between first and second sides of the capacitor C4. As the voltage of the first side of the capacitor C4 varies according to VIN (or VIN_B), the voltage of the second side of the capacitor C4 can vary as $VIN+V_{DD}$ (or $VIN\_B+V_{DD}$). In a case where the common voltage of VIN (or VIN_B) is at 0V, the VBIAS source can provide the $V_{DD}$ voltage.

The control circuit 508 has a first terminal, a second terminal, a control terminal (not shown in FIG. 5) and an output 510. The first terminal is coupled to the second output of the buffer circuitry 502 to receive $V_L$. The second terminal is coupled to the ground terminal. In some examples, the control circuit 508 includes switches SW1 and SW2. Each of the switches SW1 and SW2 has a switch control terminal, where the switch control terminals are coupled to the control terminal of the control circuit 508. SW1 is coupled between the first terminal of the control circuit 508 and the output 510, and SW2 is coupled between the second terminal of the output 510 and the ground terminal. Control circuit 508 can receive a control signal (e.g., Φ). Responsive to Φ having a high state (e.g., representing the sampling phase, or VIN being selected), SW1 can be enabled, SW2 can be disabled, and the control circuit 508 can provide $V_L$ as SEL_BOOST at the output 510. Responsive to Φ having a low state (e.g., representing the hold phase, or VIN being deselected), SW1 can be disabled, SW2 can be enabled, and the control circuit 508 can provide a ground voltage (0V) as SEL_BOOST at the output 510.

Also, the first output of the buffer circuitry 502 is coupled to the first terminal of the transistor M1. The second terminal of the transistor M1 is coupled to the output terminal 512 and to the first side of the capacitor C1. The second side of the capacitor C1 is coupled to a terminal 514, which can be ground (a reference terminal, as labeled in FIG. 5) or an output terminal (e.g., to support bottom-plate sampling).

In operation, the buffer circuitry 502 is configured to: receive VIN at its input; provide VIN_B at its first output responsive to VIN and the operations of the buffer 504; and provide $V_L$ at its second output responsive to VIN or VIN_B and the operations of the level shifter circuitry 506. The control circuit 508 is configured to: receive $V_L$ at its first terminal; and provide SEL_BOOST at its output responsive to $V_L$ and the operations of the switches SW1 and SW2. In some examples, the control signals (not shown) for switches SW1 and SW2 may be generated from $V_L$. M1 is configured to pass VIN_B to the output terminal 512 responsive to SEL_BOOST. C1 is charged responsive to VIN_B such that VIN_B is available at the output terminal 512 for use by other components of the circuit 500.

In some examples, the circuit 500 is a part of ADC circuitry of an IC such as the ADC 100 of FIG. 1. In some examples, the components of the circuit 500 are distributed on separate dies. For example, the buffer circuitry 502 may be part of a first die, while the transistor M1 and the control circuit 508 are part of a second die. The capacitor C1 may be part of the second die or may be an external component. The first and second dies may be CMOS dies, SiGe dies, BiCMOS dies, or other IC options. In other examples, the components of the circuit 500 are on a single die such as a CMOS die, a SiGe die, a BiCMOS die, or other IC options.

Figure 6:
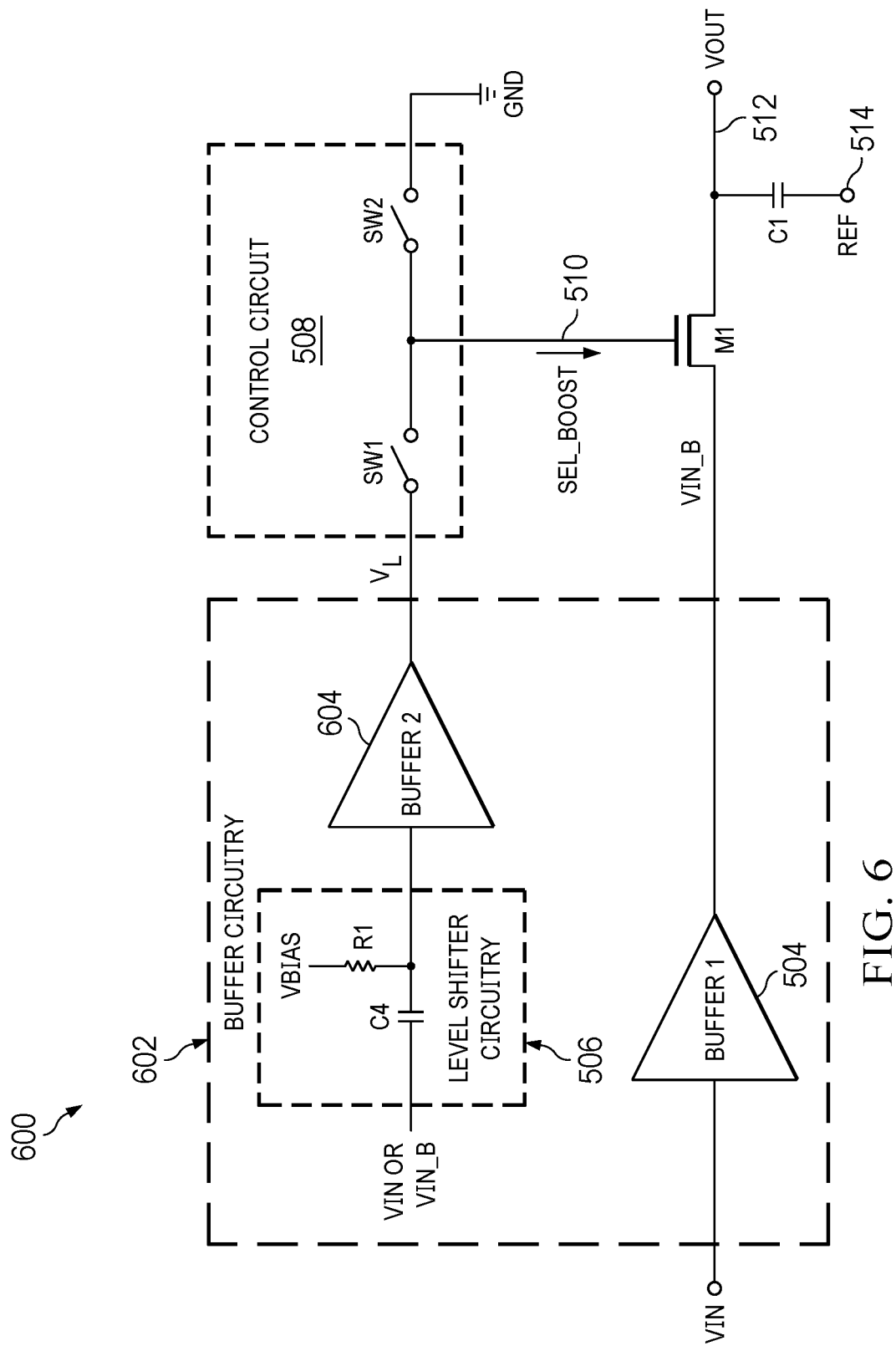

In the example of FIG. 6, the circuit 600 includes buffer circuitry 602, the control circuit 508, the transistor M1, the capacitor C1, the output terminal 512, the reference terminal 514, and the ground terminal. As shown, the buffer circuitry 602 has an input, a first output, and a second output. The buffer circuitry 602 includes a buffer 604, the level shifter circuitry 506, and the buffer 504. As shown, the buffer 604 is coupled between the output of the level shifter circuitry 506 and the second output of the buffer circuitry 602. The buffer 504 is between the input of the buffer circuitry 602 and the first output of the buffer circuitry 602. Buffer 504 can be an example of buffer circuitry 302 of FIG. 3. Level shifter circuitry 506 can be an example of level shifter circuitry 306 of FIG. 3. The control circuit 508 can be an example of control circuit 308 of FIG. 3. The operations of the circuit 600 are similar to the operations of the circuit 500. In addition, buffer 604 provides a buffered $V_L$. The buffered $V_L$ is provided to the first terminal of the control circuit 508, and control circuit 508 can provide the buffered $V_L$ as SEL_BOOST responsive to the control signal Φ having a high state. The control circuit 508 can also provide the ground voltage as SEL_BOOST responsive to the control signal Φ having a low state, as described above.

In operation, the buffer circuitry 602 is configured to: receive VIN at its input; provide VIN_B at its first output responsive to VIN and the operations of the buffer 504; and provide a buffered $V_L$ at its second output responsive to VIN or VIN_B, the operations of the level shifter circuitry 506, and the operations of the buffer 604. The control circuit 508 is configured to: receive the buffered $V_L$ at its first terminal; and provide SEL_BOOST at its output responsive to the buffered $V_L$ and the operations of the switches SW1 and SW2. In some examples, the control signals (not shown) for switches SW1 and SW2 may be generated from the buffered $V_L$. M1 is configured to pass VIN_B to the output terminal 512 responsive to SEL_BOOST. C1 is charged responsive to VIN_B such that VIN_B is available at the output terminal 512 for use by other components of the circuit 600.

In some examples, the circuit 600 is a part of ADC circuitry of an IC such as the ADC 100 of FIG. 1. In some examples, the components of the circuit 600 are distributed on separate dies. For example, the buffer circuitry 602 may be part of a first die, while the transistor M1 and the control circuit 508 are part of a second die. The capacitor C1 may be part of the second die or may be an external component. The first and second dies may be CMOS dies, SiGe dies, BiCMOS dies, or other IC options. In other examples, the components of the circuit 600 are on a single die such as a CMOS die, a SiGe die, a BiCMOS die, or other IC options.

Figure 7:
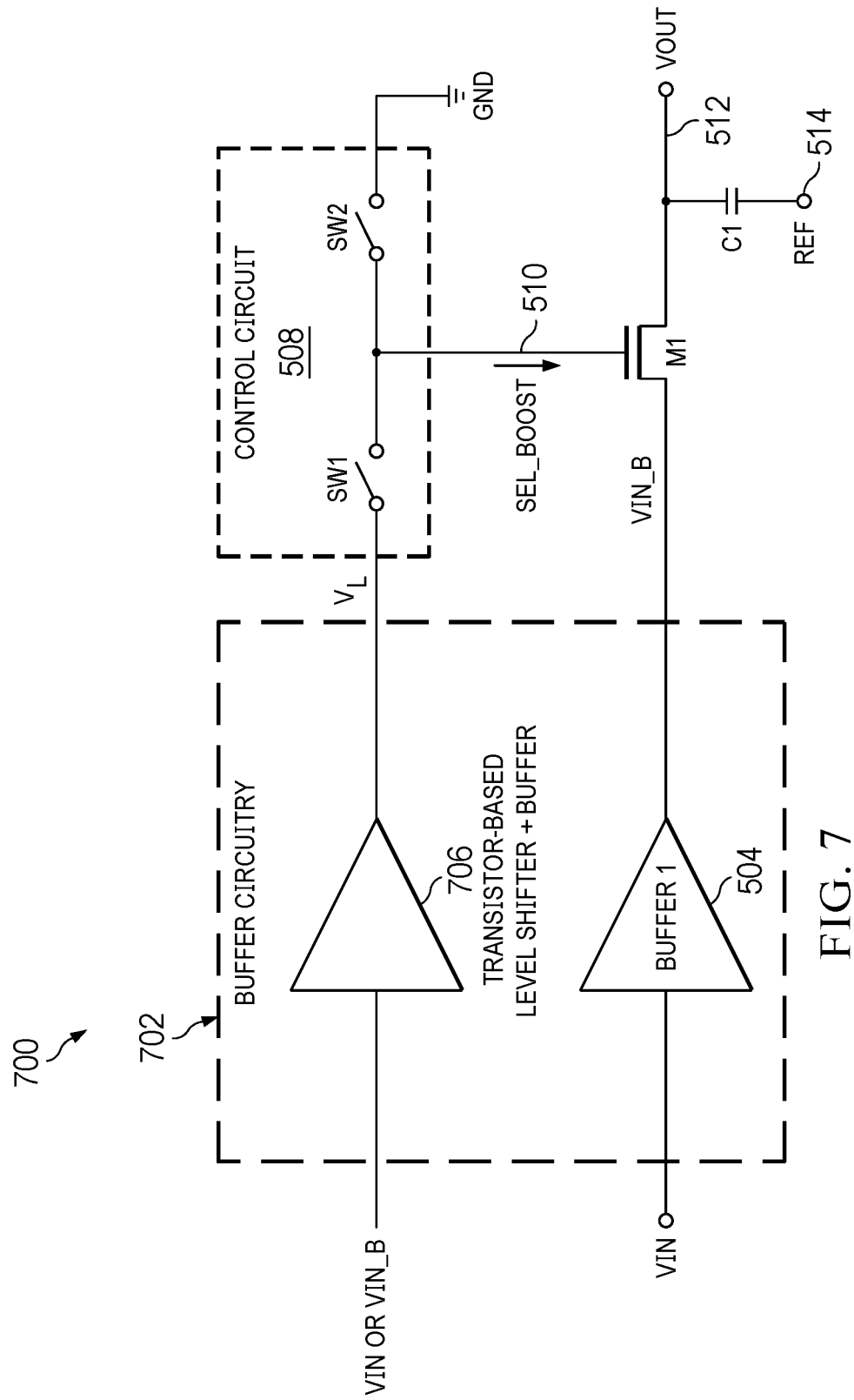

In the example of FIG. 7, the circuit 700 includes buffer circuitry 702, the control circuit 508, the transistor M1, the capacitor C1, the output terminal 512, the reference terminal 514, and the ground terminal. The buffer circuitry 702 includes a transistor-based level shifter and buffer circuit 706, and buffer 504. Buffer circuitry 702 can include level shifter circuitry 306 of FIG. 3, and buffer 504, which can be an example of buffer circuitry 302 of FIG. 3. Also, control circuit 508 can be an example of control circuit 308 of FIG. 3. The operations of the circuit 700 are similar to the operations of the circuits 500 and 600, where $V_L$ is buffered. The buffered $V_L$ is provided to the first terminal of the control circuit 508, which can provide the buffered $V_L$ as SEL_BOOST responsive to the control signal D having a high state, as described above.

In operation, the buffer circuitry 702 is configured to: receive VIN at its input; provide VIN_B at its first output responsive to VIN and the operations of the buffer 504; and provide a buffered $V_L$ at its second output responsive to VIN or VIN_B and the operations of the transistor-based level shifter and buffer circuit 706. The control circuit 508 is configured to: receive the buffered $V_L$ at its first terminal; and provide SEL_BOOST at its output responsive to the buffered $V_L$ and the operations of the switches SW1 and SW2. In some examples, the control signals (not shown) for switches SW1 and SW2 may be generated from the buffered $V_L$. M1 is configured to pass VIN_B to the output terminal 512 responsive to SEL_BOOST. C1 is charged responsive to VIN_B such that VIN_B is available at the output terminal 512 for use by other components of the circuit 700.

In some examples, the circuit 700 is a part of ADC circuitry of an IC such as the ADC 100 of FIG. 1. In some examples, the components of the circuit 700 are distributed on separate dies. For example, the buffer circuitry 702 may be part of a first die, while the transistor M1 and the control circuit 508 are part of a second die. The capacitor C1 may be part of the second die or may be an external component. The first and second dies may be CMOS dies, SiGe dies, BiCMOS dies, or other IC options. In other examples, the components of the circuit 700 are on a single die such as a CMOS die, a SiGe die, a BiCMOS die, or other IC options.

Figure 8:
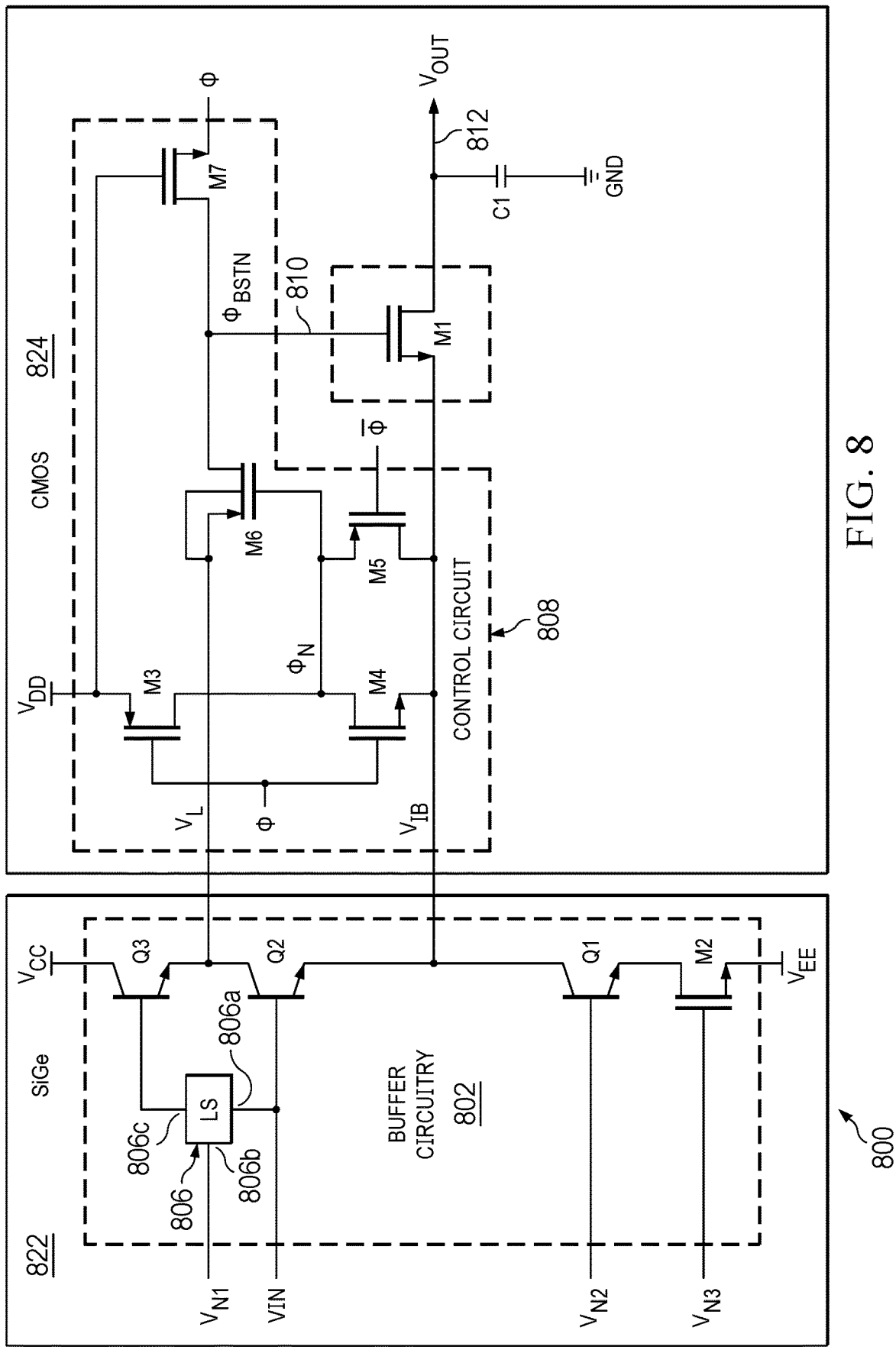

FIG. 8 illustrates an example of heterogenous buffer circuitry and bootstrapped switch, where the buffer circuitry and the bootstrapped switch are formed using different devices. As shown, the circuit 800 includes buffer circuitry 802, a control circuit 808, the transistor M1, the capacitor C1, an output terminal 812, and a ground terminal. The buffer circuitry 802 has a first power supply terminal to receive a voltage $V_{CC}$, a second power supply terminal to receive a voltage $V_{EE}$, a first voltage terminal to receive a bias voltage $V_{N1}$, a second voltage terminal to receive a bias voltage $V_{N2}$, a third voltage terminal to receive a bias voltage $V_{N3}$, an input terminal to receive VIN, a level shift output to provide a voltage $V_{LN}$ that is a level-shifted version of VIN, and a buffer output to provide a voltage $V_{IB}$ that is a buffered version of VIN. $V_{IB}$ can be an example of VIN_B. In some examples, the buffer circuitry 802 includes level shifter circuitry 806 and transistors Q1, Q2, Q3, and M2. Each of the transistors Q1, Q2, Q3 and M2 has a control terminal. The level shifter circuitry 806 has an input 806a, a bias terminal 806b, and an output 806c. In some examples, the level shifter circuitry 806 can include components of the level shifter circuitry 506 of FIGS. 5 and 6. Buffer circuitry 802 can be an example of buffer circuitry 602 of FIG. 6 and buffer circuitry 702 of FIG. 7, where Q3 represents buffers 604/704 and Q2 represents buffer 504. Voltage $V_{IB}$ can be an example of VIN_B. Q1, Q2, and Q3 can be bipolar transistors (BJT), and M2 can be a field effect transistor (FET). Also, control circuit 808 can be an example of control circuit 508 of FIGS. 5-7. In some examples, the buffer circuitry 802 is part of an SiGe portion 822, while the control circuit 808, M1 and C1 are part of a CMOS portion 824. In some examples, the SiGe portion 822 is a first die, while the CMOS portion 824 is a second die. In other examples, the SiGe portion 822 and the CMOS portion 824 are different portions of the same die. In some examples, $V_{CC}$ can be at 2.5V, $V_{EE}$ can be at −1V, $V_{DD}$ can be at 1V, and the control signals Φ and $\overline{Φ}$ can be between 0 to 1V (0 to $V_{DD}$).

As shown, the transistors Q3, Q2, Q1, and M2 of the buffer circuitry 802 are coupled in series between the first power supply terminal (to receive $V_{CC}$) and the second power supply terminal (to receive $V_{EE}$). Q3 is coupled between the first power supply terminal and the level shift output, and is configured as a voltage buffer (e.g., an emitter follower). The control terminal of the transistor Q3 is coupled to the output of the level shifter circuitry 806. Q2 is coupled between the level shift output and the buffer output. The control terminal of Q2 is coupled to input terminal to receive VIN, and Q2 is also configured as an emitter follower. In some examples, Q2 and Q3 are in a cascode configuration.

Also, M2 is coupled between the second power terminal and Q1, and Q1 is coupled between M2 and Q2. The control terminal of the transistor Q1 is coupled to the second voltage terminal (to receive $V_{N2}$). The control terminal of the transistor M2 is coupled to the third voltage terminal (to receive $V_{N3}$). M2 is configured as a current sink/source to provide a bias current to Q2 and Q3, and Q1 is configured as a cascode device. In some examples, Q1 and M2 are also in a cascode configuration.

The control circuit 808 has a third power supply terminal to receive to receive a $V_{DD}$ voltage, a level shift input to receive $V_L$, a first control terminal to receive a control signal Φ, a second control terminal to receive an inverted control signal $\overline{Φ}$, a buffered input terminal to receive $V_{IB}$, and a switch control output terminal 810 coupled to the control terminal of switch M1. As described above, Φ and $\overline{Φ}$ can be a clock signal of FIG. 1 or a selection signal of FIG. 2.

In some examples, the control circuit 808 includes transistors M3, M4, M5, M6, and M7 in the arrangement shown in FIG. 8. Each of the transistors M3 to M7 has a control terminal. Transistors M3, M5, and M6 can be PFET (e.g., p-channel metal oxide field effect transistor, PMOS), and transistors M4 and M7 can be NFET (e.g., n-channel metal oxide field effect transistor, NMOS). M3 and M4 can be coupled in series between the third power supply terminal (to receive $V_{DD}$) and the buffered input terminal (to receive $V_{IB}$). Also, M5 is coupled between a current terminal of M4 and the buffered input terminal. Together, M4 and M5 operate as a CMOS transmission gate. The control terminals of M3 and M4 are coupled to the first control terminal (to receive Φ), and the control terminal of M5 is coupled to the second control terminal (to receive $\overline{Φ}$). M6 is coupled between the level shift input and the switch control output terminal 810. M7 is coupled between the first control terminal (to receive Φ) and the switch control output terminal 810. The control terminal of M6 is coupled to the current terminal of M4 to receive a voltage $Φ_N$. The control terminal of M7 is coupled to the third power supply terminal. The first terminal of the transistor M1 is coupled to the buffer output of the buffer circuitry 802 to receive $V_{IB}$. The second terminal of the transistor M1 is coupled to the output terminal 812 and the first side of the capacitor C1. In other words, the transistor M1 is coupled between the buffer output of the buffer circuitry 802 and the output terminal 812. The second side of the capacitor C1 is coupled to a ground terminal.

The transistors M3 to M7 can operate as switches SW1 and SW2 of FIGS. 5-7. Specifically, responsive to control signal Φ having a high state, the transistors M3 to M7 can operate to provide $V_L$ as a control signal $Φ_{BSTN}$ representing a bootstrapped version of control signal Φ, to enable switch M1 and to improve the linearity of M1 when enabled. Also, responsive to the control signal Φ having a low state (e.g., at a ground voltage), the transistors M3 to M7 can provide Φ having the low state as control signal $Φ_{BSTN}$ to disable switch M1, as described in FIG. 4.

When control signal Φ is in a high state (e.g., at $V_{DD}$) and $\overline{Φ}$ is in a low state (e.g., at 0V), the transmission gate of M4 and M5 can be enabled to set the gate voltage of M6 (labelled $Φ_N$) to $V_{IB}$ (the buffered version of VIN). M6 can be enabled to connect the gate of M1 to the level shift output of buffer circuitry 802, and M6 can transmit $V_L$ to output terminal 810 as control signal $Φ_{BSTN}$, where $Φ_{BSTN}$ can be a bootstrapped version of VIN (e.g., VIN+$V_{DD}$ or VIN_B+$V_{DD}$). Also, M7 can be disabled because one of the drain/source voltages ($Φ_{BSTN}$) is higher than the gate voltage ($V_{DD}$).

Also, when control signal Φ is in low state at 0V (and $\overline{Φ}$ is in the high state at $V_{DD}$), the transmission gate of M4 and M5 can be disabled, M3 is enabled to set $Φ_N$ to $V_{DD}$, which disables M6 and disconnect the gate of M1 from the level shift output of buffer circuitry 802. Also, M7 can be enabled because the gate voltage ($V_{DD}$) exceeds the drain voltage (0V) by more than the threshold voltage of M7, and M7 can set $Φ_{BSTN}$ to 0V.

In operation, the buffer circuitry 802 is configured to: receive $V_{CC}$ at its first power supply terminal; receive VIN at its input terminal; receive $V_{N1}$ at its first voltage terminal; receive $V_{N2}$ at its second voltage terminal; receive $V_{N3}$ at its third voltage terminal; receive $V_{EE}$ at its second power supply terminal; provide $V_L$ at its level shift output and provide $V_{IB}$ at its buffer output responsive to $V_{CC}$, VIN, $V_{N1}$, $V_{N2}$, $V_{N3}$, $V_{EE}$ and the operations of the transistors M2, Q1 to Q3, and the level shifter circuitry 806. The control circuit 808 is configured to: receive $V_{DD}$ at its second power supply terminal; receive Φ at its first control terminal; receive $\overline{Φ}$ at its second control terminal; receive $V_{IB}$ at its buffered input voltage terminal; and provide a control signal $Φ_{BSTN}$ at the output 810 responsive to $V_{DD}$, Φ, $\overline{Φ}$, $V_{IB}$, and the operations of the transistors M3 to M7. The operations of the transistors M3 to M7 include operating the transistors M4 and M5 as a transmission gate. M1 is configured to pass $V_{IB}$ to the output terminal 812 responsive to $Φ_{BSTN}$. C1 is charged responsive to $V_{IB}$ such that $V_{IB}$ is available at the output terminal 812 for use by other components of the circuit 800.

Figure 9:
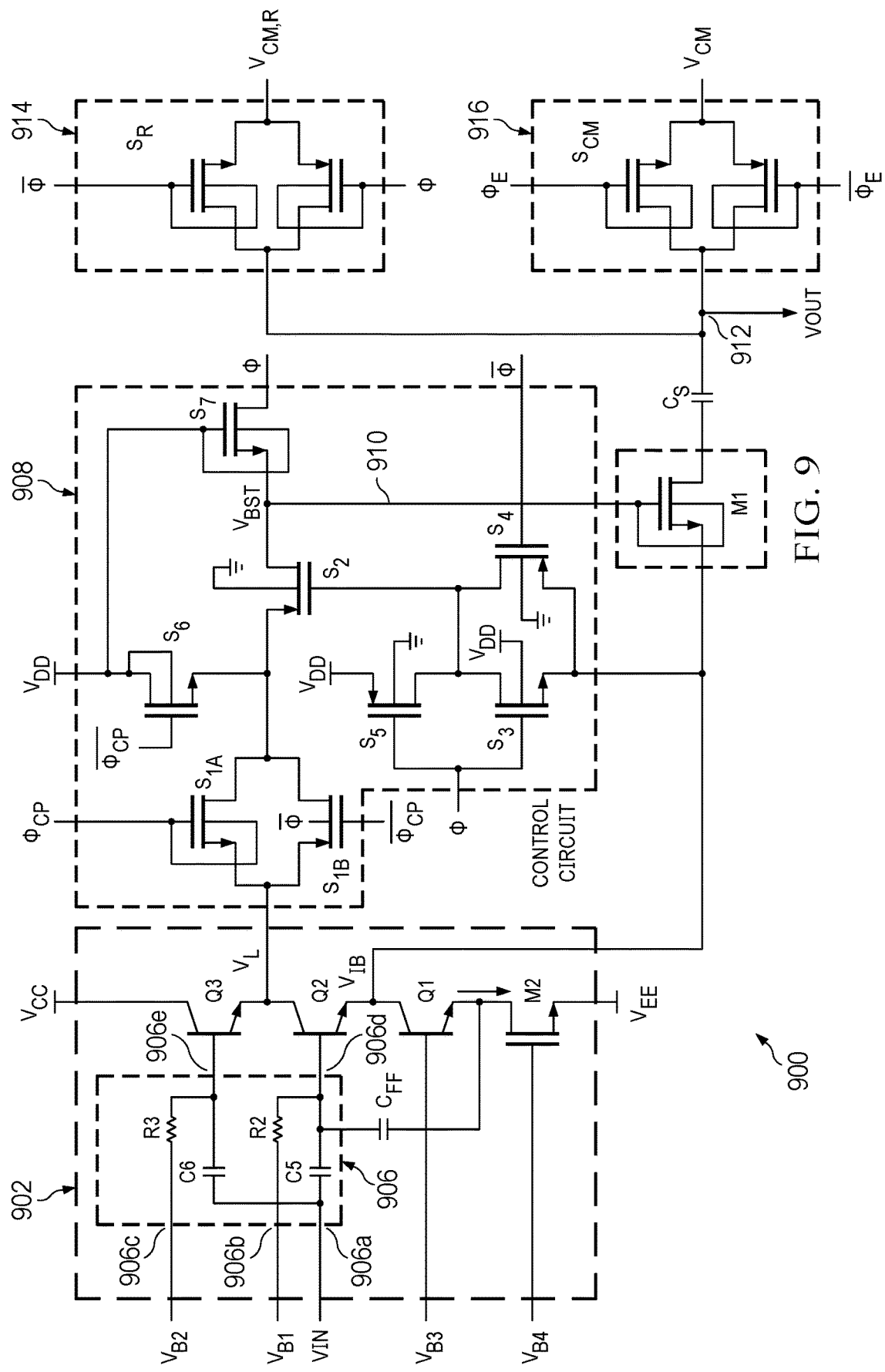
FIG. 9 is a schematic diagram illustrating an example circuit including buffer circuit and a bootstrapped switch.

FIG. 9 illustrates an example circuit 900 that includes a bootstrapped switch. Circuit 900 can be a heterogenous buffer circuitry and bootstrapped switch. The circuit 900 can be a bottom-plate sampling S/H circuit and can be part of ADC 100 of FIG. 1. The circuit 900 includes buffer circuitry 902, a control circuit 908, the transistor M1, a sampling capacitor $C_S$ that correspond to capacitor C1, an output terminal 912, a first transmission gate 914, and a second transmission gate 916. The buffer circuitry 902 has a first power supply terminal to receive the $V_{CC}$ voltage (e.g., 2.5V), a second power supply terminal to receive the $V_{EE}$ voltage (e.g., −1.0V), a first voltage terminal to receive a first bias voltage $V_{B1}$, a second voltage terminal to receive a second bias voltage $V_{B2}$, a third voltage terminal to receive a third bias voltage $V_{B3}$, a fourth voltage terminal to receive a fourth bias voltage $V_{B4}$, an input terminal to receive VIN, a level shift output to provide $V_L$, and a buffer output to provide $V_{IB}$. In some examples, the buffer circuitry 902 includes level shifter circuitry 906, capacitor $C_{FF}$, and the transistors Q1 to Q3 and M2. The level shifter circuitry 906 has an input 906*a*, a first bias terminal 906*b*, a second bias terminal 906*c*, a first output 906*d*, and a second output 906*e*. The level shifter circuitry 906 can receive VIN at input 906*a* and provide level shifted versions of VIN at first output 906*d* and second output 906*e*. Buffer circuitry 902 can be an example of the buffer circuitry 802, and level shifter circuitry 906 can be an example of level shifter circuitry 806 of FIG. 8. Also, voltage $V_{IB}$ can be an example of VIN_B.

As shown, the transistors Q3, Q2, Q1, and M2 of the buffer circuitry 902 are coupled in series between the first power supply terminal (to receive $V_{CC}$) and the second power supply terminal (to receive $V_{EE}$). Q3 is coupled between the first power supply terminal and the level shift output. A control terminal of Q3 is coupled to the second output 906*e* of the level shifter circuitry 906 to receive a level shifted version of VIN, and Q3 is configured as a voltage buffer (e.g., an emitter follower). Q2 is coupled between the level shift output and the buffer output. A control terminal of Q2 is coupled to the first output 906*d* of the level shifter circuitry 906 to receive another level shifted version of VIN, and Q2 is also configured as a voltage buffer (e.g., an emitter follower). In some examples Q2 and Q3 can be in a cascode configuration.

Also, M2 is coupled between the second power terminal and Q1, and Q1 is coupled between M2 and Q2. The control terminal of the transistor Q1 is coupled to the second voltage terminal (to receive $V_{B3}$). The control terminal of the transistor M2 is coupled to the third voltage terminal (to receive $V_{B4}$). M2 is configured as a current sink/source to provide a bias current to Q2 and Q3, and Q1 is configured as a cascode device. In some examples, Q1 and M2 are also in a cascode configuration. Q1, Q2, Q3 can be BJTs, and M2 can be FET. Q1, Q2, Q3, and M2 can be on a SiGe portion/die. The input 906*a* of level shifter circuitry 906 is coupled to the input terminal to receive VIN. The first bias terminal 906*b* of the level shifter circuitry 906 is coupled to the first voltage terminal of the buffer circuitry 902 to receive $V_{B1}$. The second bias terminal 906*c* of the level shifter circuitry 906 is coupled to the second voltage terminal of the buffer circuitry 902 to receive $V_{B2}$. As described above, the control terminal of the transistor Q3 is coupled to the second output 906*e* of the level shifter circuitry 906. Also, the first output 906*d* of the level shifter circuitry 906 is coupled to the control terminal of the transistor Q2 and to the first side of the capacitor $C_{FF}$. The second side of the capacitor $C_{FF}$ is coupled to a current terminal of M2. The $C_{FF}$ capacitor can be a feed-forward capacitor to provide additional AC current at the buffer output to improve linearity.

In some examples, the level shifter circuitry 906 includes resistors R2 and R3, and capacitors C5 and C6 in the arrangement shown in FIG. 9. Specifically, the first side of the resistor R3 is coupled to the second bias terminal 906*c* of the level shifter circuitry 906. The second side of the resistor R3 is coupled to the second output 906*e* of the level shifter circuitry 906. The first side of the resistor R2 is coupled to the first bias terminal 906*b* of the level shifter circuitry 906. The second side of the resistor R2 is coupled to the first output 906*d* of the level shifter circuitry 906. The first sides of the capacitors C5 and C6 are coupled to the input 906*a* of the level shifter circuitry 906. The second side of the capacitor C5 is coupled to the first output 906*d* of the level shifter circuitry 906. The second side of the capacitor C6 is coupled to the second output 906*e* of the level shifter circuitry 906. The level shift output of the buffer circuitry 902 (to provide $V_L$) is coupled to the second terminal of Q3 and the first terminal of Q2.

The control circuit 908 has a third power supply terminal to receive $V_{DD}$, a level shift input to receive $V_L$, a first control terminal to receive control signal Φ, a second control terminal to receive control signal CD, a third control terminal to receive a control signal $Φ_{CP}$, a fourth control terminal to receive a control signal $\overline{Φ_{CP}}$, a buffered voltage terminal to receive $V_{IB}$, and an output terminal 910. Control signal $Φ_{CP}$ can be a level-shifted version of Φ and have the same logical state, where $Φ_{CP}$ can be at a high state when Φ is in the high state, and $Φ_{CP}$ can be at a low state when Φ is in the low state. In some examples, $Φ_{CP}$ can have a voltage range between $V_{DD}$ and $2V_{DD}$. The control signal $\overline{Φ_{CP}}$ can be an inverted version of $Φ_{CP}$ (e.g., having opposite states). Also, the control signal $Φ_E$ can be a phase shifted (early) version of Φ, and $\overline{Φ_E}$ is an inverted version of $Φ_E$.

In some examples, the control circuit 908 includes transistors $S_{1A}$, $S_{1B}$, and $S_2$, $S_3$, $S_4$, $S_5$, $S_6$, and $S_7$ in the arrangement shown. $S_5$, $S_3$, $S_4$, $S_2$, and $S_7$ can correspond to, respectively, M3, M4, M5, M6, and M7 of FIG. 8, and their operations are similar to as described in FIG. 8. Also, $S_{1A}$ is an NMOS transistor, $S_{1B}$ is a PMOS transistor, and $S_{1A}$ and $S_{1B}$ form a CMOS transmission gate between the level shift input and $S_2$. The substrate and the control terminal of $S_{1A}$ is coupled to the third control terminal to receive $Φ_{CP}$. The control terminal of $S_{1B}$ is coupled to the fourth control terminal to receive $\overline{Φ_{CP}}$, and the substrate of $S_{1B}$ is coupled to the second control terminal to receive $\overline{Φ}$. Further, $S_6$ is coupled between the third power supply terminal and $S_2$, and has a control terminal coupled to the fourth control terminal to receive $\overline{Φ_{CP}}$. $S_{1A}$ and $S_{1B}$ can provide dynamic forward body biasing (FBB) of switches. Also, transistors $S_2$ to $S_7$ are biased using static FBB. FBB can reduce the threshold voltages of these transistors, which can further improve the overall linearity of the circuit 900. The control circuit 908 and capacitor $C_S$ can be on a CMOS portion/die.

In addition, the first transmission gate 914 is coupled between the second side (e.g., bottom plate) of the capacitor $C_S$ and a first common mode terminal (to receive $V_{CM,R}$). The first transmission gate 914 has control terminals to receive control signals Φ and $\overline{Φ}$. The first transmission gate 914 can be enabled to set the bottom plate of $C_S$ at $V_{CM,R}$ responsive to Φ having a low state (e.g., during the hold phase), and can be disabled responsive to Φ having a high state (e.g., during the sampling phase). Also, the second transmission gate 916 is coupled between the second side (e.g., bottom plate) of the capacitor $C_S$ and a second common mode terminal (to receive $V_{CM}$). The second transmission gate 916 has control terminals to receive control signals $Φ_E$ and $\overline{Φ_E}$. The second transmission gate 916 can be enabled to set the bottom plate of $C_S$ at $V_{CM}$ responsive to $Φ_E$ having a low state (e.g., during the hold phase), and can be disabled responsive to $Φ_E$ having a high state (e.g., during the sampling phase). The first and second transmission gates 914 and 916 are controlled by control signals Φ and $Φ_E$ to perform bottom-plate sampling with sampling capacitor $C_S$.

In operation, the buffer circuitry 902 is configured to: receive $V_{CC}$ at its first power supply terminal; receive VIN at its input terminal; receive $V_{B1}$ at its first voltage terminal; receive $V_{B2}$ at its second voltage terminal; receive $V_{B3}$ at its third voltage terminal; receive $V_{B4}$ at its fourth voltage terminal; receive $V_{EE}$ at its second power supply terminal; provide $V_L$ at its level shift output and provide $V_{IB}$ at its buffer output responsive to $V_{CC}$, VIN, $V_{B1}$, $V_{B2}$, $V_{B3}$, $V_{B4}$, $V_{EE}$ and the operations of the transistors M2, Q1 to Q3, and the level shifter circuitry 906. The control circuit 908 is configured to: receive $V_{DD}$ at its third power supply terminal; receive $\Phi$ at its first control terminal; receive $\overline{\Phi}$ at its second control terminal; receive $\Phi_{CP}$ at its third control terminal; receive $\sqrt{\Phi_{CP}}$ at its fourth control terminal; receive $V_{IB}$ at its buffered voltage terminal; and provide a control signal at the output terminal 910 responsive to $V_{DD}$, $\Phi$, $\overline{\Phi}$, $\Phi_{CP}$, $\overline{\Phi_{CP}}$, $V_{IB}$, and the operations of the transistors $S_{1A}$, $S_{1B}$, and $S_2$ to $S_7$. The operations of the transistors $S_{1A}$, $S_{1B}$, and $S_2$ to $S_7$ include operating the transistors $S_{1A}$ and $S_{1B}$ as a transmission gate, and operating the transistors $S_3$ and $S_4$ as a transmission gate. M1 is configured to pass $V_{IB}$ to the capacitor $C_S$ responsive to the control signal at the output terminal 910 of the control circuit 908. The first transmission gate 914 is configured to provide $V_{CM,R}$ as its output responsive to the voltage at the first side of $C_S$, $\Phi$, and $\overline{\Phi}$. The second transmission gate 914 is configured to provide $V_{CM}$ and as its output responsive to the voltage at the second side of $C_S$, $\Phi_E$, and $\overline{\Phi_E}$.

Figure 10:
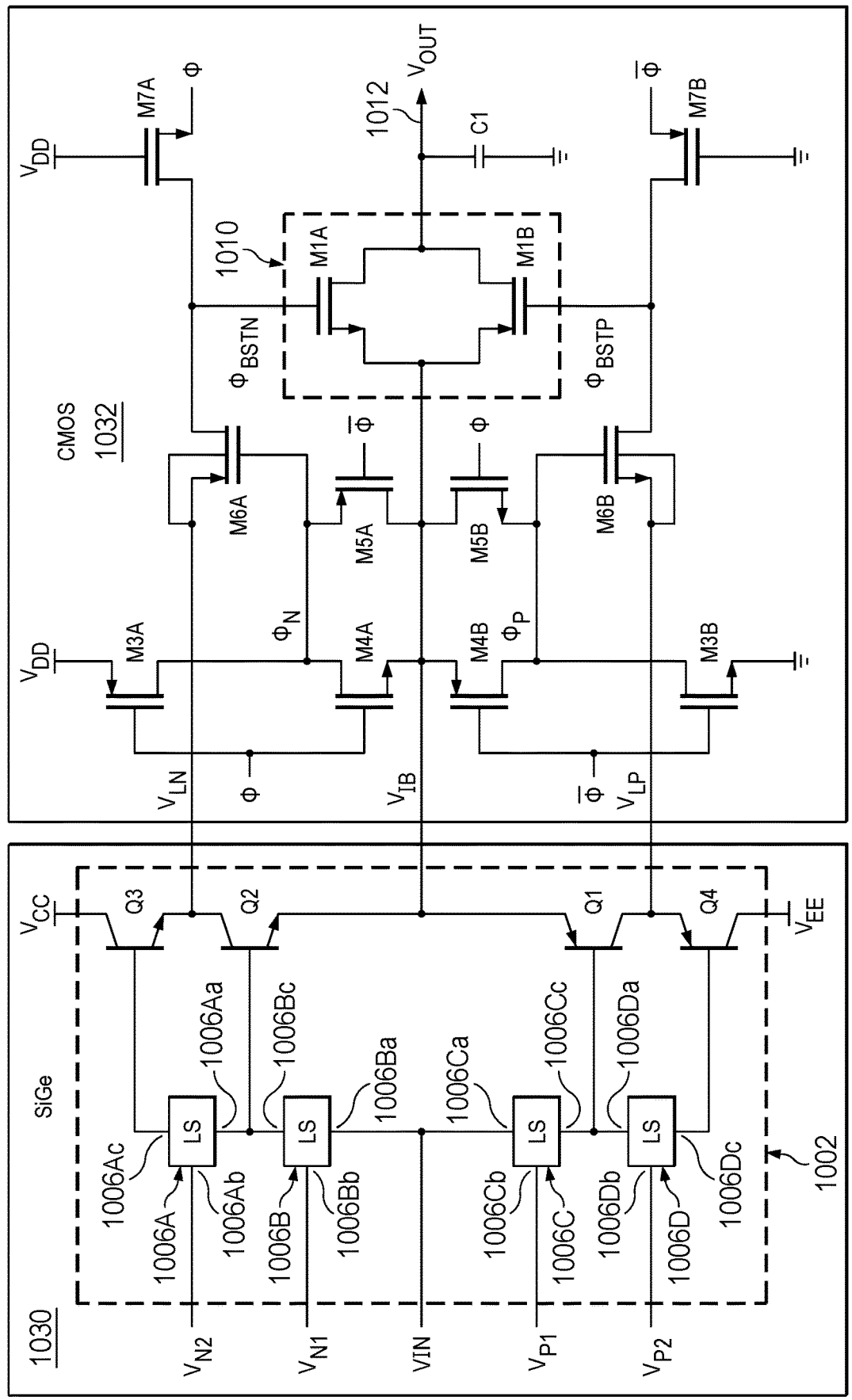
FIG. 10 is a schematic diagram illustrating an example circuit including buffer circuit and a bootstrapped switch.

FIG. 10 illustrates another example circuit 1000 including a bootstrapped switch, which can be part of ADC 100 and multiplexer 200. The circuit 1000 can include a heterogenous buffer circuitry and bootstrapped switch, and includes buffer circuitry 1002, transistors M1A and M1B, the capacitor C1, and an output terminal 1012. The buffer circuitry 1002 has a first power supply terminal to receive $V_{CC}$, a second power supply terminal to receive $V_{EE}$, a first voltage terminal to receive a first bias voltage $V_{N1}$, a second voltage terminal to receive second bias voltage $V_{N2}$, a third voltage terminal to receive a third bias voltage $V_{P1}$, a fourth voltage terminal to receive a fourth bias voltage $V_{P2}$, an input terminal to receive VIN, a first level shift output to provide $V_{LN}$, a buffer output to provide $V_{IB}$, and a second level shift output to provide $V_{LP}$.

In some examples, the buffer circuitry 1002 includes level shifter circuitry and transistors Q1, Q2, Q3, and Q4. The level shifter circuitry includes level shifter circuitry 1006A, 1006B, 1006C, and 1006D. Each of the level shifter circuitries 1006A to 1006D has an input, a bias terminal, and an output. Buffer circuit 1002 can be an example of buffer circuitry 602 of FIG. 6 or buffer circuitry 702 of FIG. 7, and each of level shifter circuitries 1006A to 1006D can be an example of level shifter circuitry 506 of FIG. 6. Transistors M1A and M1B can be an example of transistor M1 to be controlled by respective bootstrapped control signals $\Phi_{BSTN}$ and $\Phi_{BSTP}$. Also, voltage $V_{IB}$ can be an example of VIN_B.

In some examples, the buffer circuitry 1002 is part of an SiGe portion 1030, while the first and second sets transistors, M1 and C1 are part of a CMOS portion 1032. In some examples, the SiGe portion 1030 is a first die, while the CMOS portion 1032 is a second die. In other examples, the SiGe portion 1030 and the CMOS portion 1032 are different portions of the same die.

As shown, each of level shifter circuitries 1006A to 1006D has a respective input, a respective bias terminal, and a respective output. The level shifter circuitry 1006A has input 1006Aa, bias terminal 1006Ab, and output 1006Ac. The level shifter circuitry 1006B has input 1006Ba, bias terminal 1006Bb, and output 1006Bc. The level shifter circuitry 1006C has input 1006Ca, bias terminal 1006Cb, and output 1006Cc. The level shifter circuitry 1006D has input 1006Da, bias terminal 1006Db, and output 1006Dc. The output 1006Ac of the level shifter circuitry 1006A is coupled to the control terminal of the transistor Q3. The bias terminal 1006Ab of the level shifter circuitry 1006A is coupled to the second voltage terminal of the buffer circuitry 1002 to receive $V_{N2}$. The input 1006Aa of the level shifter circuitry 1006A is coupled to the control terminal of the transistor Q2 and to the output 1006Bc of the level shifter circuitry 1006B. The bias terminal 1006Bb of the level shifter circuitry 1006B is coupled to the first voltage terminal of the buffer circuitry 1002 to receive $V_{N1}$. The input 1006Ba of the level shifter circuitry 1006B is coupled to the input terminal of the buffer circuitry 1002 to receive VIN. The bias terminal 1006Cb of the level shifter circuitry 1006C is coupled to the third voltage terminal of the buffer circuitry 1002 to receive $V_{P1}$. The input 1006Ca of the level shifter circuitry 1006C is coupled to the input terminal of the buffer circuitry 1002 to receive VIN. The output 1006Cc of the level shifter circuitry 1006C is coupled to the control terminal of the transistor Q1 and to the input 1006Da of the level shifter circuitry 1006D. The bias terminal 1006Db of the level shifter circuitry 1006D is coupled to the fourth voltage terminal of the buffer circuitry 1002 to receive $V_{P2}$. The output 1006Dc of the level shifter circuitry 1006D is coupled to the control terminal of the transistor Q4.

Also, the transistors Q3, Q2, Q1, and Q4 of the buffer circuitry 1002 are coupled in series between the first power supply terminal (to receive $V_{CC}$) and the second power supply terminal (to receive $V_{EE}$). Q3 is coupled between the first power supply terminal and the first level shift output and configured as a voltage buffer (e.g., an emitter follower). Q2 is coupled between the first level shift output and the buffer output and configured as a voltage buffer (e.g., an emitter follower). Q1 is coupled between the buffer output and the second level shift output and configured as a voltage buffer (e.g., an emitter follower). Q4 is coupled between the second level shift output and the second power supply terminal and configured as a voltage buffer (e.g., an emitter follower). Q3 and Q2 can be NPN bipolar transistors, and Q1 and Q4 can be PNP bipolar transistors. The buffer circuitry 1002 in FIG. 10 can have a push-pull emitter follower configuration where each of transistors Q1, Q2, Q3, and Q4 is an emitter follower, and each transistor is driven by a level-shifted version of VIN. The push-pull configuration can provide improved power efficiency.

In the example of FIG. 10, the circuit 1000 includes a first set of transistors M3A, M4A, M5A, M6A, and M7A to control the operations of the transistor M1A, which is an NMOS. The first set of transistors M3A to M7A have the same arrangement as the transistors M3 to M7 of the control circuit 808 in FIG. 8. The circuit 1000 also includes a second set of transistors M3B to M7B to control the operation of transistor M1B, which is a PMOS. The second set of transistors M3B, M4B, M5B, M6B, and M7B are arranged similar to the transistors M3 to M7 of the control circuit 808 in FIG. 8, but have opposite types from M3A-M7A. In some examples, the transistor M3A is a PMOS transistor, while the transistor M3B is an NMOS transistor. The transistor M4A is an NMOS transistor, while the transistor M4B is a PMOS transistor. The transistor M5A is a PMOS transistor, while the transistor M5B is an NMOS transistor. The transistor M6A is a PMOS transistor, while the transistor M6B is an NMOS transistor. The transistor M7A is an NMOS transistor, while the transistor M7B is a PMOS transistor. Also, the control signals $\Phi$ and $\overline{\Phi}$ and the voltage supplies ($V_{DD}$ versus GND) are different for the first set of transistors used to control the transistor M1A and the second set of transistors used to control the transistor M1B.

In some examples, the first and second sets of transistors (M3A to M7A and M3B to M7B) may be part of a control circuit having a third control terminal to receive $V_{DD}$, a buffered voltage terminal to receive $V_{IB}$, a first level shift input to receive $V_{LN}$, a second level shift input to receive $V_{LP}$, a first control terminal to receive $\Phi$, a second control terminal to receive $\overline{\Phi}$, a first output to provide $\Phi_{BSTN}$, and a second output to provide $\Phi_{BSTP}$. Each of the first and second set of transistors (M3A to M7A and M3B to M7B) can correspond to transistors M3-M7 of control circuit 808. When 0 is in a high state (e.g., at $V_{DD}$), transistor M6A can be controlled to provide $\Phi_{BSTN}$ as a bootstrapped version of VIN (e.g., VIN+$V_{DD}$) to the gate of transistor M1A, and transistor M6B can be controlled to provide $\Phi_{BSTP}$ as a bootstrapped version of VIN (e.g., VIN−$V_{DD}$) to the gate of transistor M1B. The operations of the transistors M3A to M7A include operating the transistors M4A and M5A as a transmission gate. The operations of the transistors M3B to M7B include operating the transistors M4B and M5B as a transmission gate. The transistors M1A and M1B operate as a transmission gate 1010 configured to pass $V_{IB}$ to the output terminal 1012 responsive to $\Phi_{BSTN}$ and $\Phi_{BSTP}$. By having transmission gate 1010 as a switch, where the transmission gate includes a pair of NMOS M1A and PMOS M1B coupled in parallel, the range of $V_{IB}$ in which the switch is linear can be further increased, which can further increase the overall linearity of circuit 1000. On the other hand, when 0 is in a low state (e.g., at 0V), transistor M7A can set $\Phi_{BSTN}$ to 0V, and transistor M7B can set $\Phi_{BSTP}$ to $V_{DD}$, to disable respective transistors/switches M1A and M1B.

In operation, the buffer circuitry 1002 is configured to: receive $V_{CC}$ at its first power supply terminal; receive VIN at its input terminal; receive $V_{N1}$ at its first voltage terminal; receive $V_{N2}$ at its second voltage terminal; receive $V_{P1}$ at its third voltage terminal; receive $V_{P2}$ at its fourth voltage terminal; receive $V_{EE}$ at its second power supply terminal; provide $V_{LN}$ at its first level shift output, provide $V_{LP}$ at its second level shift output, and provide $V_{IB}$ at its buffer output responsive to $V_{CC}$, VIN, $V_{N1}$, $V_{N2}$, $V_{P1}$, $V_{P1}$, $V_{EE}$, the operations of the transistors Q1 to Q4, and the operations of the level shifter circuitries 1006A to 1006D. The control circuit (e.g., M3A to M7A and M3B to M7B in the arrangement shown) is configured to: receive $V_{DD}$ at its third power supply terminal; receive $\Phi$ at its first control terminal; receive $\overline{\Phi}$ at its second control terminal; receive $V_{IB}$ at its buffered voltage terminal; provide $\Phi_{BSTN}$ to the control terminal of the transistor M1A responsive to $V_{DD}$, $\Phi$, $\overline{\Phi}$, $V_{IB}$, and the operations of the transistors M3A to M7A; provide $\Phi_{BSTP}$ to the control terminal of the transistor M1B responsive to GND, $\Phi$, $\overline{\Phi}$, $V_{IB}$, and the operations of the transistors M3B to M7B. As described above, the operations of the transistors M3A to M7A include operating the transistors M4A and M5A as a transmission gate. The operations of the transistors M3B to M7B include operating the transistors M4B and M5B as a transmission gate. The transistors M1A and M1B operate as a transmission gate 1010 configured to pass $V_{IB}$ to the output terminal 1012 responsive to $\Phi_{BSTN}$ and $\Phi_{BSTP}$. C1 is charged responsive to $V_{IB}$ such that $V_{IB}$ is available at the output terminal 1012 for use by other components of the circuit 1000.

Figure 11:
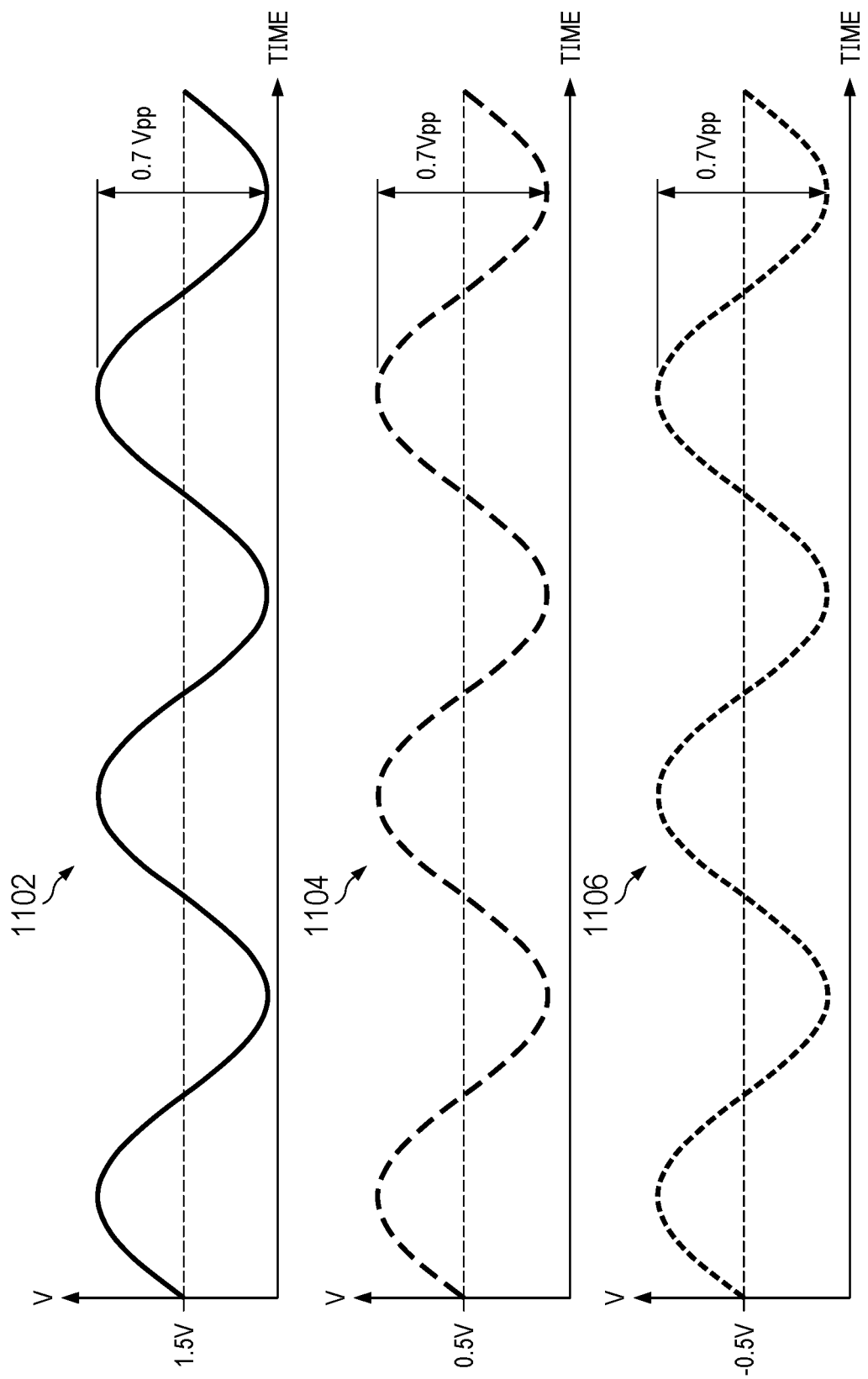
FIG. 11 includes graphs representing example operations of the circuit of FIG. 10.

FIG. 11 includes graphs representing example operations of the time-variations of signals of circuit 1000 of FIG. 10. As shown, graph 1102 shows example variation of $V_{IB}$ with time, graph 1104 shows example variation of $V_{LN}$ with time, and graph 1106 shows example variation of $V_{LP}$ with time. In the example of FIG. 11, $V_{IB}$ is centered at 0.5V, $V_{LN}$ is centered at 1.5V, and $V_{LP}$ is centered at −0.5V, and each has a peak-to-peak voltage (Vpp) of 0.7V. In different examples, the direct-current (DC) level at which $V_{IB}$ is centered may vary. Also, the amount of level shift (i.e., the offset) between $V_{IB}$ and $V_{LN}$ and/or the amount of level shift between $V_{IB}$ and $V_{LP}$ may vary.

Figure 12:
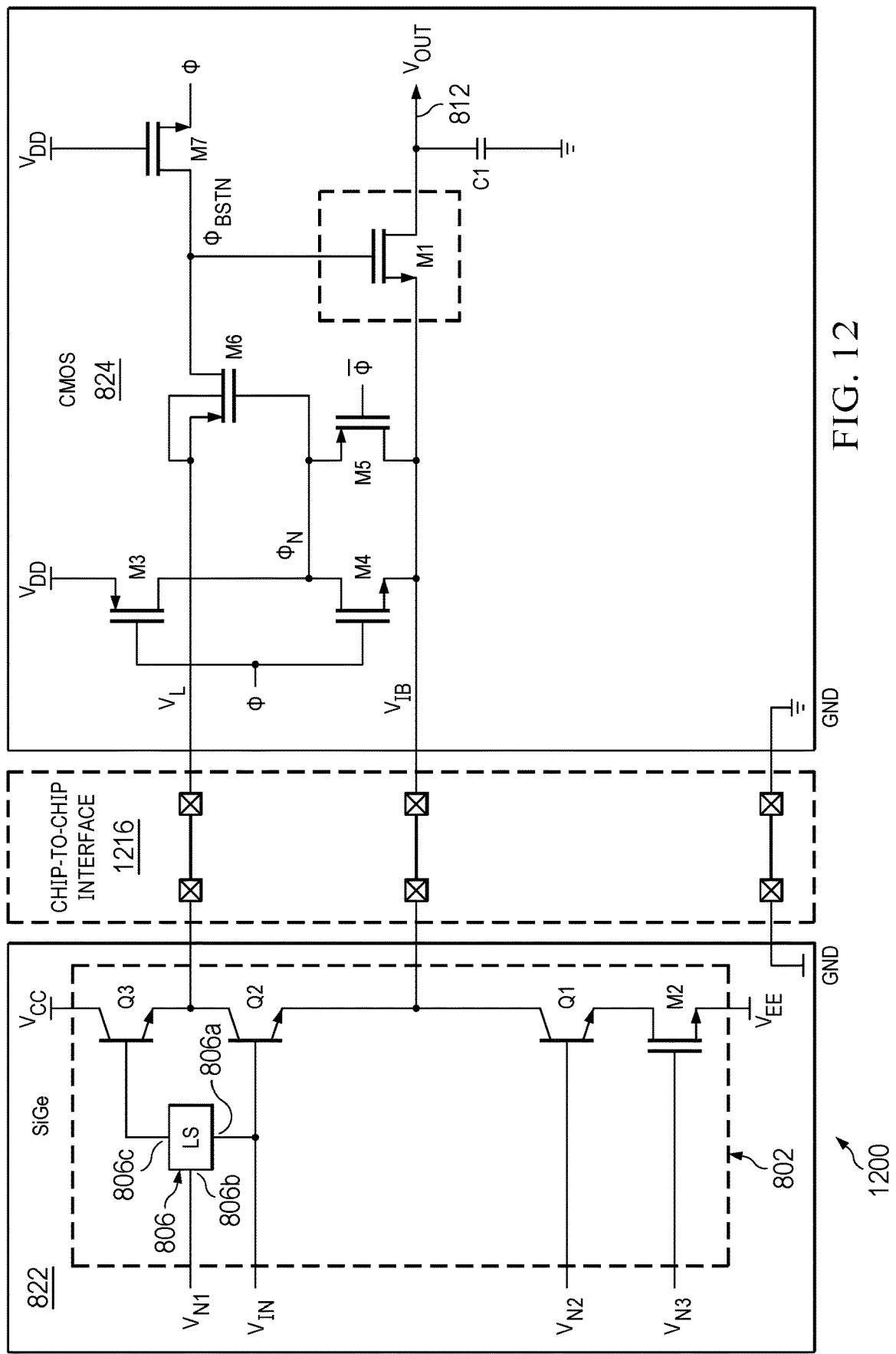
FIG. 12 is a schematic diagram illustrating an example circuit including the circuit of FIG. 8.

FIG. 12 is a schematic diagram illustrating an example circuit 1200 In the example of FIG. 12, the circuit 1200 includes the components described for the circuit 800 of FIG. 8. In addition, the circuit 1200 incudes a chip-to-chip interface 1216 between the SiGe portion 822 and the CMOS portion 824. In some examples, the chip-to-chip interface 1216 is used to transfer $V_L$ and $V_{IB}$ from the SiGe portion 822 to the CMOS portion 824. Also, the chip-to-chip interface 1216 may be used to couple ground terminals of the SiGe portion 822 and the CMOS portion 824.

Figure 13:
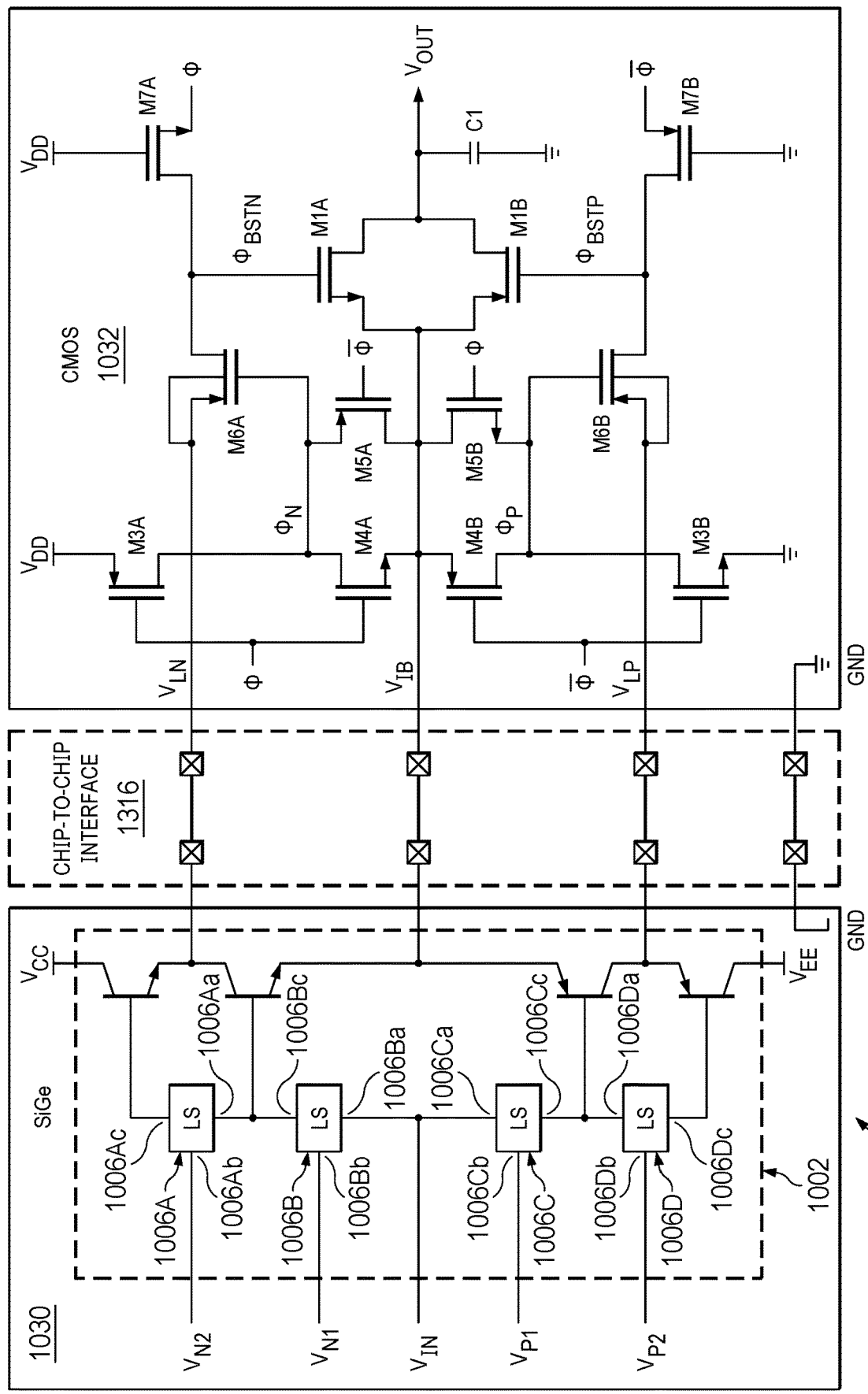
FIG. 13 is a schematic diagram illustrating an example circuit including the circuit of FIG. 10.

FIG. 13 is a schematic diagram illustrating an example circuit 1300. In the example of FIG. 13, the circuit 1300 includes the components described for the circuit 1000 of FIG. 10. In addition, the circuit 1300 incudes a chip-to-chip interface 1316 between the SiGe portion 1030 and the CMOS portion 1032. In some examples, the chip-to-chip interface 1316 is used to transfer $V_{LN}$, $V_{IB}$, and $V_{LP}$ from the SiGe portion 1030 to the CMOS portion 1032. Also, the chip-to-chip interface 1316 may be used to couple ground terminals of the SiGe portion 1030 and the CMOS portion 1032.

Figure 14A:
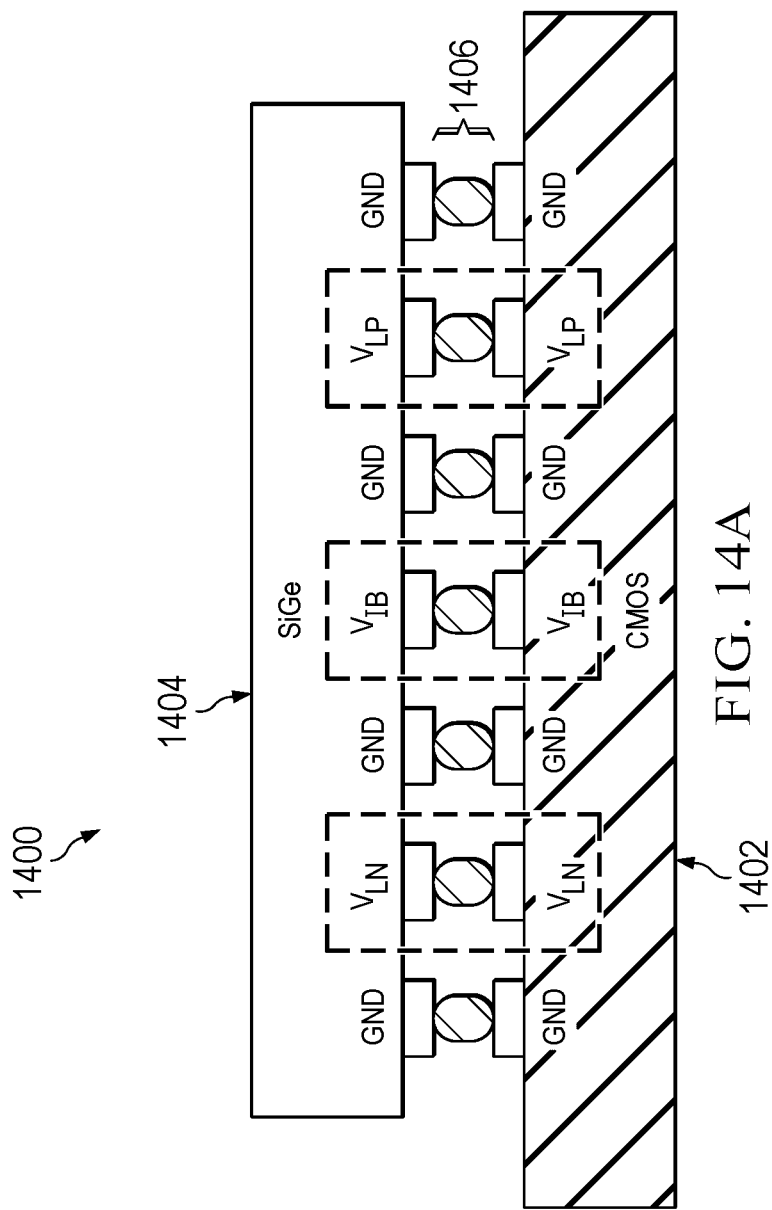
FIGS. 14A, 14B, and 14C are schematics illustrating example cross-sectional views of a semiconductor device and a system including a circuit having a bootstrapped switch.
Figure 14B:
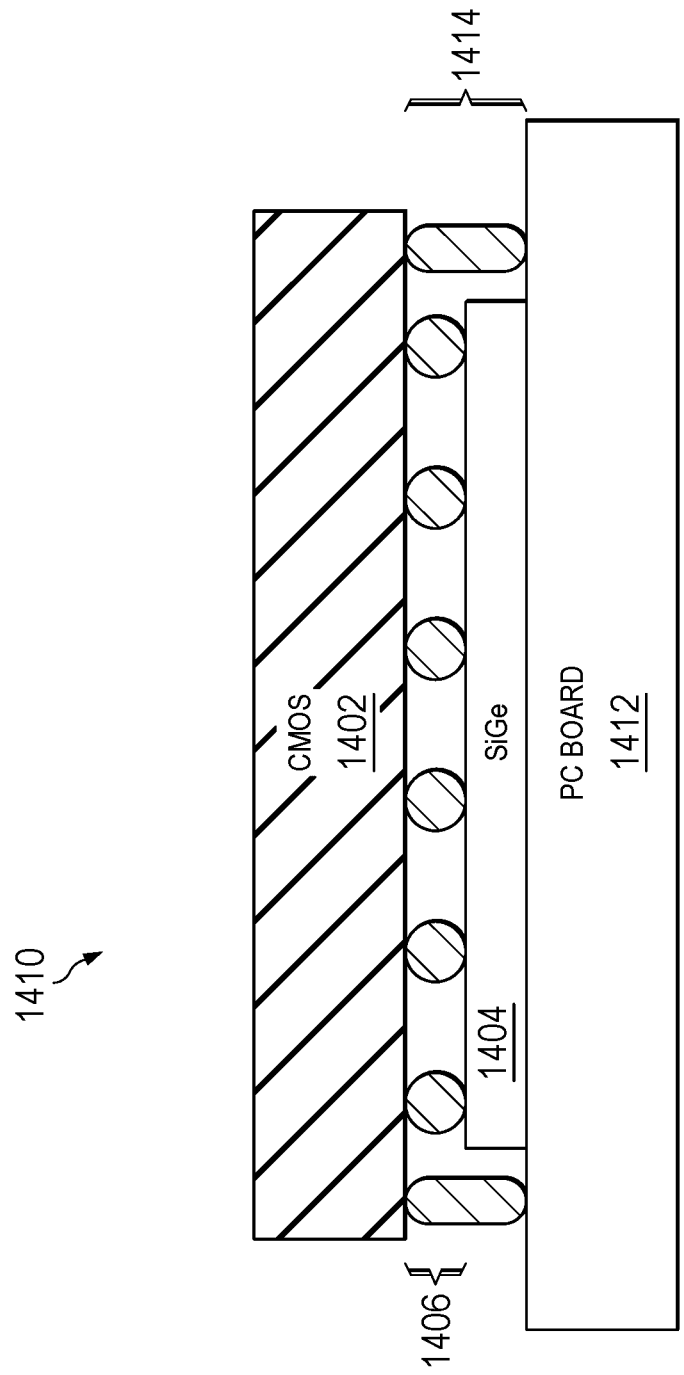
Figure 14C:
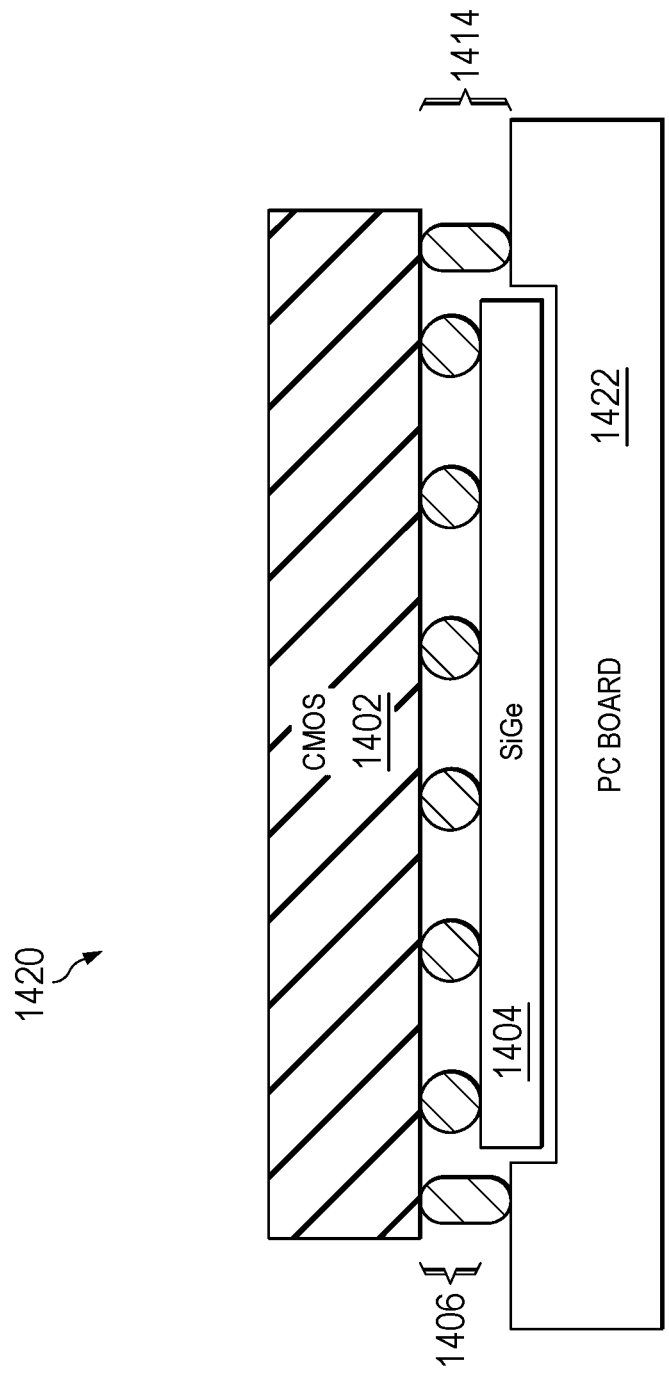

FIGS. 14A, 14B, and 14C are cross-sectional views of semiconductor devices and systems including a circuit having a bootstrapped switch, such as circuits 300, 500, 600, 700, 800, 900, 1000, 1200, and 1300 as described above. In the example of FIG. 14A, a semiconductor device 1400 includes a CMOS die 1402 and SiGe die 1404. As shown, the CMOS die 1402 includes a first pad for $V_{LN}$, a second pad for $V_{IB}$, a third pad for $V_{LP}$, and adjacent pads on each side of the $V_{LN}$ pad, the $V_{IB}$ pad, and the $V_{LP}$ for GND. The SiGe die 1404 also includes a first pad for $V_{LN}$, a second pad for $V_{IB}$, a third pad for $V_{LP}$, and adjacent pads on each side of the $V_{LN}$ pad, the $V_{IB}$ pad, and the $V_{LP}$ for GND. In the semiconductor device 1400, the respective first pads for $V_{LN}$, the respective second pads for $V_{IB}$, the respective third pads for $V_{LP}$, and the respective adjacent pads for GND of the CMOS die 1402 and the SiGe die 1404 are aligned and conductive elements (e.g., solder) 1406 is added to couple the respective pads together. With the semiconductor device 1400, the properties (e.g., size, material, conductivity, etc.) of the pads and/or the conductive material may be selected to ensure the combined functionality of the CMOS die 1402 and SiGe die 1404 achieves a target linearity and/or a target bandwidth for $V_{IB}$, $V_{LN}$, and/or $V_{LP}$.

In the example of FIG. 14B, a system 1410 includes the CMOS die 1402, the SiGe die 1404, a printed circuit board (PCB) 1412, the conductive elements 1406, and conductive elements 1414. In the system 1410, the SiGe die 1404 is between the CMOS die 1402 and the PCB 1412. In some examples, the SiGe die 1404 is mechanically and/or electrically coupled to the surface of the PCB 1412. The conductive elements 1406 are between the SiGe die 1404 and the CMOS die 1402 to electrically couple respective pads such as the first pads for $V_L$, the second pads for $V_{IB}$, the third pads for $V_{LP}$, and adjacent pads for GND described in FIG. 14a. The conductive elements 1414 couple pads of the CMOS die 1402 to pads of the PCB 1412 to extend ground connections, power signals, and/or other signals between the PCB 1412 and the CMOS die 1402.

In the example of FIG. 14C, a system 1420 includes the CMOS die 1402, the SiGe die 1404, a PCB 1422, the conductive elements 1406, and the conductive elements 1414. In the system 1420, the SiGe die 1404 is between the CMOS die 1402 and the PCB 1422. In some examples, the SiGe die 1404 is mechanically and/or electrically coupled to the surface of the PCB 1412. In addition, the PCB 1422 includes a cutout or cavity for the SiGe die 1404. Again, the conductive elements 1406 are between the SiGe die 1404 and the CMOS die 1402 to electrically couple respective pads such as the first pads for $V_{LN}$, the second pads for $V_{IB}$, the third pads for $V_{LP}$, and the adjacent pads for GND described in FIG. 14*a*. The conductive elements 1414 couple pads of the CMOS die 1402 to pads of the PCB 1422 to extend ground connections, power signals, and/or other signals between the PCB 1422 and the CMOS die 1402. In some examples, the SiGe die 1404 of FIGS. 14*a*-14*c* includes buffer circuit and/or level shifter circuitry, while the CMOS die 1402 includes a switch and a related control circuit as described herein. As desired, the SiGe die 1404 and/or the CMOS die 1402 may include additional components.

Figure 15:
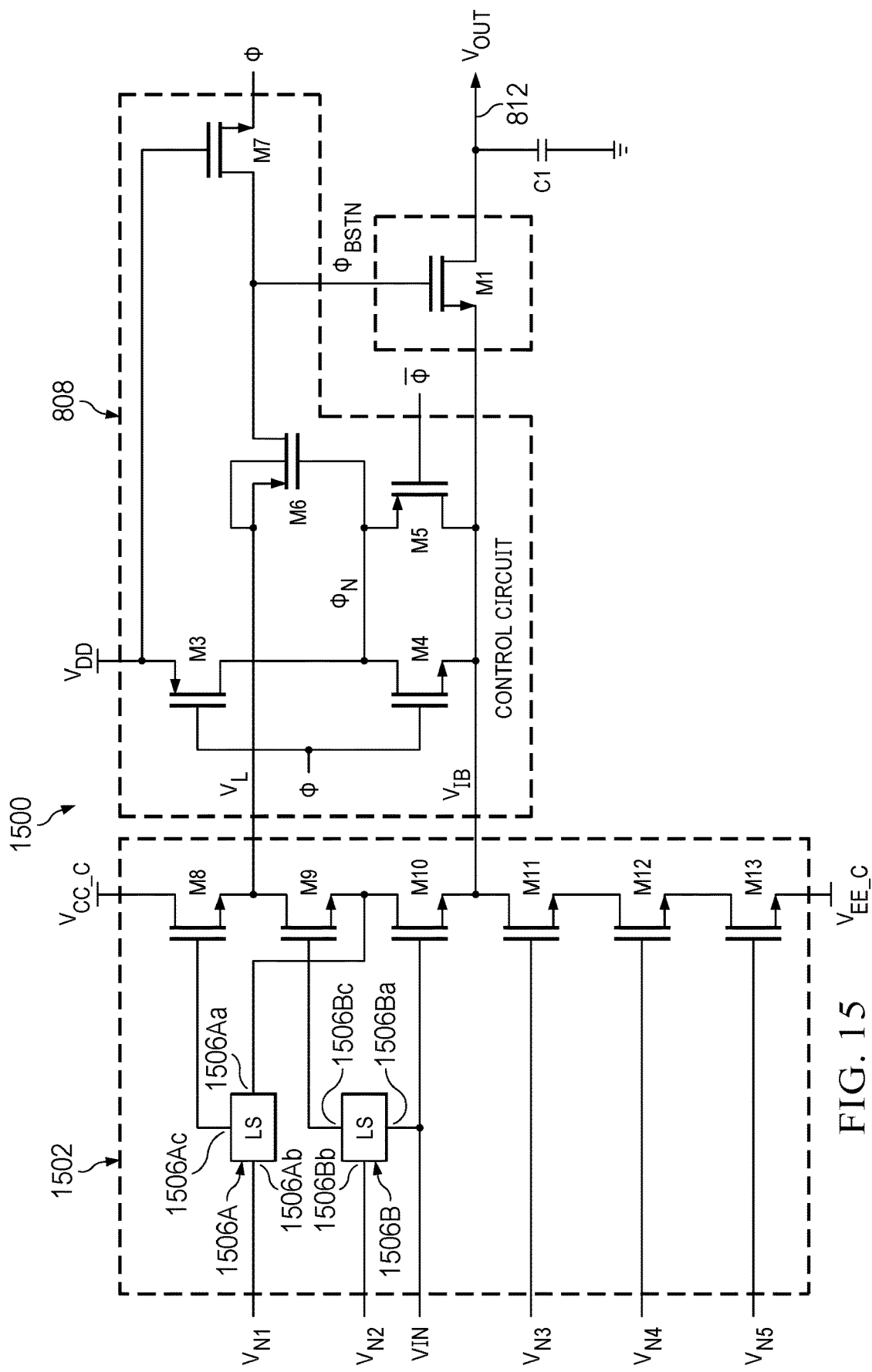
FIGS. 15 and 16 are schematic diagrams illustrating example components of the circuit of FIG. 3.
Figure 16:
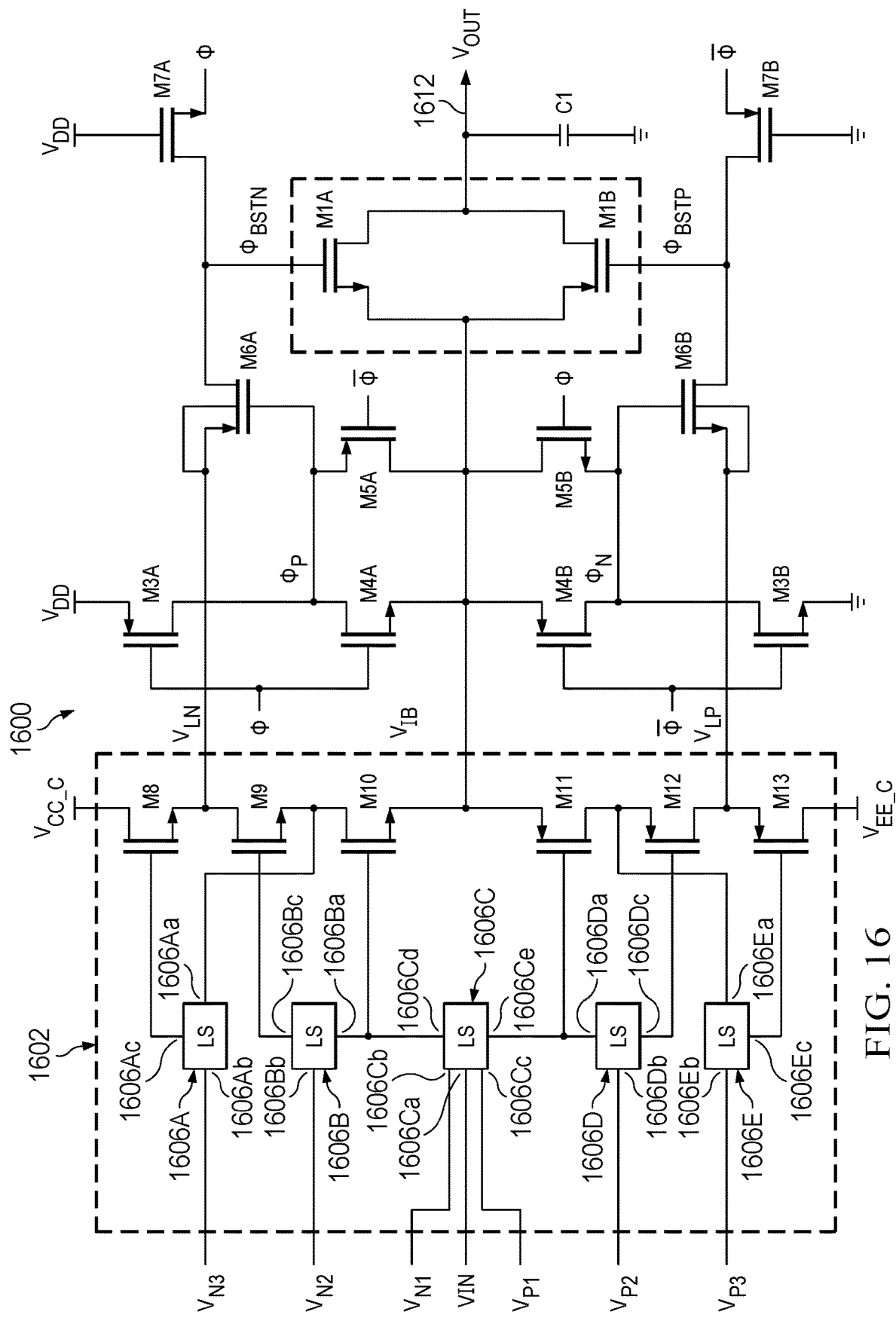

FIGS. 15 and 16 are schematic diagrams illustrating examples of integrated buffer circuitry and bootstrapped switches. In some examples, the circuits 1500 and 1600 include NMOS and PMOS transistors and can be part of a homogeneous process IC (e.g., complementary metal oxide (CMOS) IC). As shown, the circuit 1500 includes buffer circuitry 1502, transistor M1, and control circuit 808 including transistors M3 to M7, the capacitor C1, and the output terminal 812. The buffer circuitry 1502 has a first power supply terminal to receive a $V_{CC\_C}$ voltage, a second power supply terminal to receive a $V_{EE\_C}$ voltage, an input terminal to receive VIN, a first voltage terminal to receive a first bias voltage $V_{N1}$, a second voltage terminal to receive a second bias voltage $V_{N2}$, a third voltage terminal to receive a third bias voltage $V_{N3}$, a fourth voltage terminal to receive a fourth bias voltage $V_{N4}$, a fifth voltage terminal to receive a fifth bias voltage $V_{N5}$, a level shift output to provide $V_L$, and a buffer output to provide $V_{IB}$. In some examples, $V_{CC\_C}$ can be at 2V, and $V_{EE\_C}$ can be at −1V.

In some examples, the buffer circuitry 1502 includes level shifter circuitry and transistors M8, M9, M10, M11, M12, and M13. Buffer circuitry 1502 can be an example of buffer circuitry 602 of FIG. 6 and buffer circuitry 702 of FIG. 7. The level shifter circuitry includes level shifter circuitries 1506A and 1506B. Each of the level shifter circuitries 1506A and 1506B has a first terminal, a second terminal, and an output. Buffer circuitry 1502 can be an example of the buffer circuitry 602, and level shifter circuitries 1506A and 1506B can include components of level shifter circuitry 506 of FIG. 5. Also, voltage $V_{IB}$ can be an example of VIN_B. In the example of FIG. 15, the transistors M3 to M7 form a control circuit such as control circuit 808 in FIG. 8.

As shown, the transistors M8 to M13 of the buffer circuitry 1502 are coupled in series between the first power supply terminal (to receive $V_{CC\_C}$) and the second power supply terminal (to receive $V_{EE\_C}$). M8 is coupled between the first power supply terminal and the level shift output as a voltage buffer (e.g., a source follower). M9 is coupled between M8 and M10 as a voltage buffer (e.g., a source follower). M10 is coupled between M9 and the buffer output as a voltage buffer (e.g., a source follower). The control terminal of M10 is coupled to the input terminal of the buffer circuitry 1502 to receive VIN, and M10 can provide a buffered version of VIN ($V_{IB}$).

The level shifter circuit 1506A has an input 1506Aa, a bias terminal 1506Ab, and an output 1506Ac. The level shifter circuit 1506B has an input 1506Ba, a bias terminal 1506Bb, and an output 1506Bc. The input 1506Ba of the level shifter circuitry 1506B is coupled to the input terminal of the buffer circuitry 1502 to receive VIN. The bias terminal 1506Bb of the level shifter circuitry 1506B is coupled to the second voltage terminal of the buffer circuitry 1502 to receive $V_{N2}$. The output 1506Bc of the level shifter circuitry 1506B is coupled to the control terminal of the transistor M9, and the transistor M9 can provide a level shifted version of VIN at a current terminal (e.g., source terminal). The input 1506Aa of the level shifter circuitry 1506A is coupled to the source terminal of the transistor M9. The bias terminal 1506Ab of the level shifter circuitry 1506A is coupled to the first voltage terminal of the buffer circuitry 1502 to receive $V_{N1}$. The output 1506Ac of the level shifter circuitry 1506A is coupled to the control terminal of the transistor M8. Accordingly, the control terminal of each of M8, M9, and M10 receives a level-shifted version of VIN. In some examples, M8, M9, and M10 can be in a cascode configuration. In some examples, the output of the buffer circuitry 1502 can also be coupled to the source terminal of the transistor M9 if full gate-source voltage ($V_{GS}$) of M1 being lower than $V_{DD}$ can be tolerated.

Also, M11, M12, and M13 are coupled in series between the buffer output and the second power supply terminal. The control terminal of the transistor M11 is coupled to the third voltage terminal of the buffer circuitry 1502 to receive $V_{N3}$. The control terminal of the transistor M12 is coupled to the fourth voltage terminal of the buffer circuitry 1502 to receive $V_{N4}$. The control terminal of the transistor M13 is coupled to the fifth voltage terminal of the buffer circuitry 1502 to receive $V_{N5}$. Transistors M11, M12, and M13 can provide a cascode current source to provide a bias current for M8, M9, and M10.

In operation, the buffer circuitry 1502 is configured to: receive $V_{DD}$ at its first power supply terminal; receive VIN at its input terminal; receive $V_{N1}$ at its first voltage terminal; receive $V_{N2}$ at its second voltage terminal; receive $V_{N3}$ at its third voltage terminal; receive $V_{N4}$ at its fourth voltage terminal; receive $V_{N5}$ at its fifth voltage terminal; receive $V_{SS}$ at its second power supply terminal; provide $V_L$ at its level shift output; and provide $V_{IB}$ at its buffer output responsive to $V_{DD}$, VIN, $V_{N1}$, $V_{N2}$, $V_{N3}$, $V_{N4}$, $V_{N5}$, and $V_{SS}$, the operations of the transistors M8 to M13, and the operations of the level shifter circuitry 1506A and 1506B. The control circuit (e.g., M3 to M7) is configured to: receive $V_{DD}$; receive $V_L$; receive Φ; receive $\overline{\Phi}$; receive $V_{IB}$; and provide $\Phi_{BSTN}$ to the control terminal of the transistor M1 responsive to $V_{DD}$, $V_L$, Φ, $\overline{\Phi}$, $V_{IB}$, and the operations of the transistors M3 to M7. The operations of the transistors M3 to M7 include operating the transistors M4 and M5 as a transmission gate. The transistor M1 is configured to pass $V_{IB}$ to the output terminal 1512 responsive to $\Phi_{BSTN}$. C1 is charged responsive to $V_{IB}$ such that $V_{IB}$ is available at the output terminal 1512 for use by other components of the circuit 1500.

Referring to FIG. 16, circuit 1600 includes buffer circuitry 1602, transistors M1A, M1B, M3A to M7A, M3B to M7B, the capacitor C1, and an output terminal 1612. The buffer circuitry 1602 has a first power supply terminal to receive $V_{CC\_C}$, a second powers supply terminal to receive $V_{EE\_C}$, an input terminal to receive VIN, a first voltage terminal to receive first bias voltage $V_{N1}$, a second voltage terminal to receive a second bias voltage $V_{N2}$, a third voltage terminal to receive a third bias voltage $V_{N3}$, a fourth voltage terminal to receive a fourth bias voltage $V_{P1}$, a fifth voltage terminal to receive a fifth bias voltage $V_{P2}$, a sixth voltage terminal to receive a sixth bias voltage $V_{P3}$, a first level shift output to provide $V_{LN}$, a second level shift output to provide $V_{LP}$, and a buffer output to provide $V_{IB}$. Buffer circuitry 1602 can be an example of buffer circuitry 602 of FIG. 6 and buffer circuitry 702 of FIG. 7. In some examples, each of the level shifter circuitry 1606A to 1606E can include components of level shifter circuitry 506.

As shown, the buffer circuitry 1602 includes level shifter circuitry 1606A, 1606B, 1606C, 1606D, and 1606E and the transistors M8, M9, M10, M11, M12, and M13. The transistors M8, M9, M10, M11, M12, and M13 of the buffer circuitry 1602 are in series between the first power supply terminal (to receive $V_{DD}$) and the second power supply terminal (to receive $V_{SS}$). The buffer circuitry 1602 can have a push-pull source follower configuration, where each of transistors M8, M9, M10, M11, M12, and M13 is source follower and driven by a level-shifted version of VIN. Specifically, M8 is coupled between the first power supply terminal and the first level shift output. M9 is coupled between the first level shift output and M10, and M10 is coupled between M9 and the buffer output. M11 is coupled between the buffer output and M12. M12 is coupled between M11 and the second level shift output. M13 is coupled between the second level shift output and the second power supply terminal. M8, M9, and M10 can be NMOS, and M11, M12, and M13 can be PMOS transistors. Each of M8-M13 can be configured as a voltage buffer (e.g., a source follower).

Each of level shifter circuitries 1606A, 1606B, 1606C, 1606D, and 1606E has a respective input, a respective bias terminal, and a respective output. The level shifter circuitry 1606A has input 1606Aa, bias terminal 1606Ab, and output 1606Ac. The level shifter circuitry 1606B has input 1606Ba, bias terminal 1606Bb, and output 1606Bc. The level shifter circuitry 1606C has input 1606Ca, a first bias terminal 1606Cb, a second bias terminal 1606Cc, a first output 1606Cd, and a second output 1606Ce. The level shifter circuitry 1606D has input 1606Da, bias terminal 1606Db, and output 1606Dc. The level shifter circuitry 1606E has input 1606Ea, bias terminal 1606Eb, and output 1606Ec. The input 1606Ca of the level shifter circuitry 1606C is coupled to the input terminal of the buffer circuitry 1602 to receive VIN. The first bias terminal 1606Cb of the level shifter circuitry 1606C is coupled to the first voltage terminal of the buffer circuitry 1602 to receive $V_{N1}$. A second bias terminal 1606Cc of the level shifter circuitry 1606C is coupled to the fourth voltage terminal of the buffer circuitry 1602 to receive $V_{P1}$. The first output 1606Cd of the level shifter circuitry 1606C is coupled to the control terminal of M10 to provide a level shifted up version of VIN to M10. The second output 1606Ce of the level shifter circuitry 1606C to the control terminal of M11 to provide a level shifted down version of VIN to M11.

Further, the input 1606Ba of the level shifter circuitry 1606B is coupled to the first output 1606Cd of the level shifter circuitry 1606C. The bias terminal 1606Bb of the level shifter circuitry 1606B is coupled to the second voltage terminal of the buffer circuitry 1602 to receive $V_{N2}$. The output 1606Bc of the level shifter circuitry 1606B is coupled to the control terminal of M9 to provide another level shifted up version of VIN, and M9 can provide a buffered version of level shifted up VIN at a current terminal (e.g., source terminal). The input 1606Aa of the level shifter circuitry 1606A is coupled to the source terminal of M9. The bias terminal 1606Ab of the level shifter circuitry 1606A is coupled to the third voltage terminal of the buffer circuitry 1602 to receive $V_{N3}$. The output 1606Ac of the level shifter circuitry 1606A is coupled to the control terminal of M8 to provide another level shifted up version of VIN.

Further, the input 1606Da of the level shifter circuitry 1606D is coupled to the second output 1606Ce of the level shifter circuitry 1606C to receive a level shifted down version of VIN. The bias terminal 1606Db of the level shifter circuitry 1606D is coupled to the fifth voltage terminal of the buffer circuitry 1602 to receive $V_{P2}$. The output 1606Dc of the level shifter circuitry 1606D is coupled to the control terminal of the transistor M12 to provide another level shifted down version of VIN, and M12 can provide a buffered version of the level shifted down VIN to the second buffer output (at M12's drain terminal and M13's source terminal). The input 1606Ea of the level shifter circuitry 1606E is coupled to the source terminal of M11. The bias terminal 1606Eb of the level shifter circuitry 1606E is coupled to the sixth voltage terminal of the buffer circuitry 1602 to receive $V_{P3}$. The output 1606Ec of the level shifter circuitry 1606E is coupled to the control terminal of M13 to provide another level shifted down version of VIN. Also, in the example of FIG. 16, the transistors M3A to M7A and M3B to M7B form a control circuit for the transistors M1A and M1B as described in FIG. 10, where M1A and M1B form transmission gate 1010.

In operation, the buffer circuitry 1602 is configured to: receive $V_{DD}$ at its first power supply terminal; receive VIN at its input terminal; receive $V_{N1}$ at its first voltage terminal; receive $V_{N2}$ at its second voltage terminal; receive $V_{N3}$ at its third voltage terminal; receive $V_{P1}$ at its fourth voltage terminal; receive $V_{P2}$ at its fifth voltage terminal; receive $V_{P3}$ at its sixth terminal; receive $V_{SS}$ at its second power supply terminal; and provide $V_{LN}$ at its first level shift output, provide $V_{LP}$ at its second level shift output, and provide $V_{IB}$ at its buffer output responsive to $V_{DD}$, VIN, $V_{N1}$, $V_{N2}$, $V_{N3}$, $V_{P1}$, $V_{P2}$, $V_{P3}$, and $V_{SS}$, the operations of the transistors M8 to M13, and the operations of the level shifter circuitry 1606A to 1606E. The control circuit (e.g., M3A to M7A and M3B to M7B) is configured to: receive $V_{DD}$; receive $V_{LN}$; receive $V_{PN}$; receive $\Phi$; receive $\overline{\Phi}$; receive $V_{IB}$; provide $\Phi_{BSTN}$ to the control terminal of the transistor M1A responsive to $V_{DD}$, $V_{LN}$, $\Phi$, $\overline{\Phi}$, $V_{IB}$, and the operations of the transistors M3A to M7A; and provide $\Phi_{BSTP}$ to the control terminal of the transistor M1B responsive to $V_{DD}$, $V_{LP}$, $\Phi$, $\overline{\Phi}$, $V_{IB}$, and the operations of the transistors M3B to M7B. The operations of the transistors M3 to M7 include: operating the transistors M4A and M5A as a transmission gate; and operating the transistors M4B and M5B as a transmission gate. The transistors M1A and M1B are configured to pass $V_{IB}$ to the output terminal 1612 responsive to $\Phi_{BSTN}$ and $\Phi_{BSTP}$. C1 is charged responsive to $V_{IB}$ such that $V_{IB}$ is available at the output terminal 1612 for use by other components of the circuit 1600.

Figure 17:
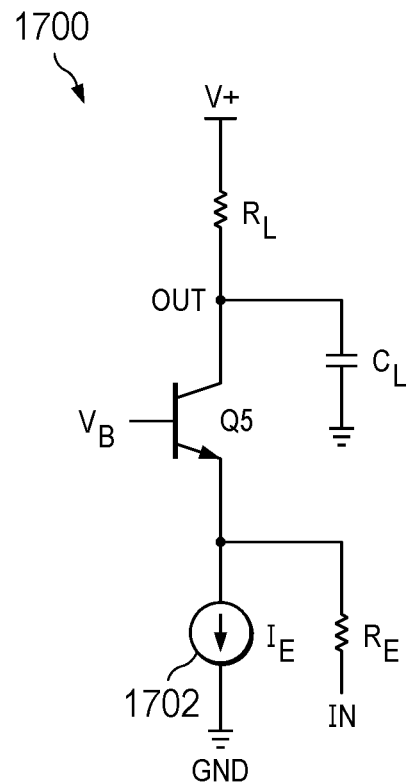
FIGS. 17 and 18 are schematic diagrams illustrating example components of the circuit of FIG. 3.
Figure 18:
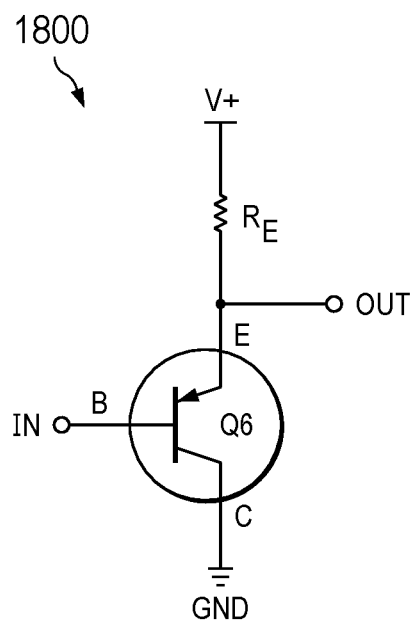

FIGS. 17 and 18 are schematic diagrams illustrating example level shifter circuitry 1700 and 1800. The level shifter circuitry 1700 and 1800 are examples of the level shifter circuitry 306 in FIG. 3 and can be part of the transistor-based level shifter and buffer circuit 706 in FIG. 7, the level shifter circuitry 806 in FIGS. 8 and 12, the level shifter circuitry 906 in FIG. 9, the level shifter circuitry 1006A to 1006D in FIGS. 10 and 13, the level shifter circuitry 1506A and 1506B in FIG. 15, and the level shifter circuitry 1606A to 1606E in FIG. 16.

In the example of FIG. 17, the level shifter circuitry 1700 includes a resistor $R_L$, a capacitor $C_L$, a transistor Q5, a resistor RE, and a current source 1702. Each of the resistor $R_L$, the capacitor $C_L$, the resistor RE, and the current source 1702 has a first side and a second side. The transistor Q5 has a first current terminal, a second current terminal, and a control terminal. The transistor Q5 can be a bipolar transistor (as shown in FIG. 17) or a field effect transistor (FET). In some examples, the first side of the resistor $R_L$ is coupled to a supply voltage terminal to receive V+. The second side of the resistor $R_L$ is coupled to the first side of the capacitor $C_L$ and to the first current terminal of the transistor Q5. The second side of the capacitor $C_L$ is coupled to a ground terminal. The second current terminal of the transistor Q5 is coupled to the first sides of the resistor RE and the current source 1702. The control terminal of the transistor Q5 is coupled to a bias voltage terminal to receive a bias voltage VB. The second side of the current source 1702 is coupled to a ground terminal. The second side of the resistor RE is coupled to an input terminal (labeled IN) for the level shifter circuitry 1700. The first terminal of the transistor Q5 is coupled to an output terminal (labeled OUT) of the level shifter circuitry 1700. The level shifter circuitry 1700 has a common base topology (or a common gate topology). The level shifter circuitry 1700 can receive a voltage VIN at the input terminal and provide a level shifted version of the voltage $V_{IB}$ or VIN_B at the output terminal. The common base/common gate topology can provide improved linearity and bandwidth, and is less susceptible to the amplification of input capacitance due to Miller effect.

In the example of FIG. 18, the level shifter circuitry 1800 includes a resistor RE and a transistor Q6. Transistor Q6 can be a BJT (as shown in FIG. 18) or a FET. The first side of RE is coupled to a supply voltage terminal to receive V+. The second side of RE is coupled to a first current terminal of the transistor Q6 (e.g., a collector or a drain) and to an output terminal. A second current terminal of the transistor Q6 is coupled to a ground terminal. The control terminal of the transistor Q6 is coupled to an input terminal (labeled IN) of the level shifter circuitry 1800. The first current terminal of the transistor Q6 is coupled to an output terminal (labeled OUT) of the level shifter circuitry 1800. The level shifter circuitry 1800 has an emitter follower or a source follower topology. The level shifter circuitry 1800 can receive a voltage VIN at the input terminal and provide a level shifted version of the voltage $V_{IB}$ or VIN_B at the output terminal. The source follower/emitter follower can also provide improved linearity and bandwidth, and is less susceptible to the amplification of input capacitance due to Miller effect.

Figure 19:
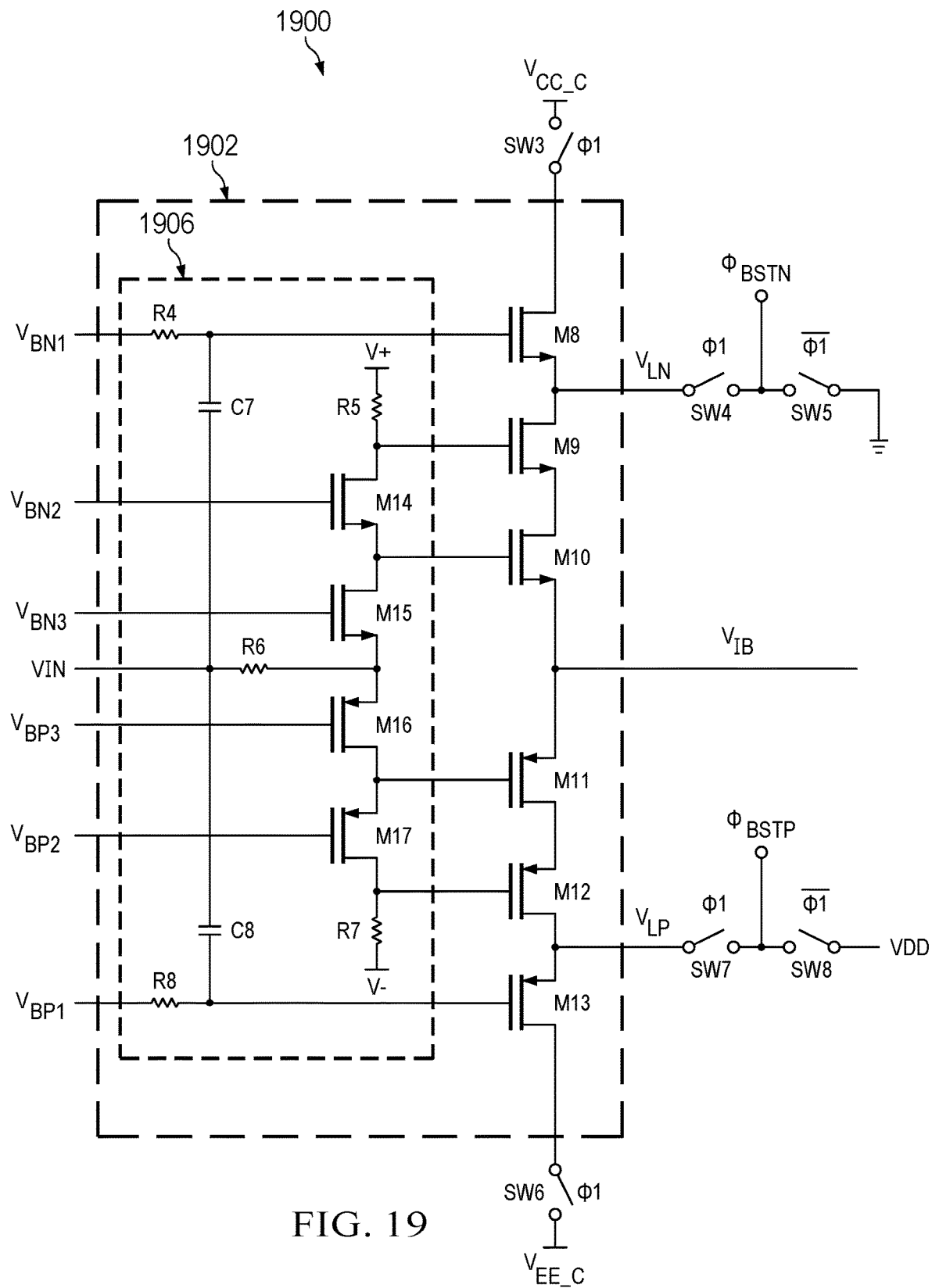
FIG. 19 is a schematic diagram illustrating example components of the circuit of FIG. 3.

FIG. 19 is a schematic diagram illustrating an example circuit 1900 including a buffer circuitry and a bootstrapped switch. The circuit 1900 includes buffer circuitry 1902 and switches SW3, SW4, SW5, SW6, SW7, and SW8. The buffer circuitry 1902 includes transistors M8, M9, M10, M11, M12, and M13. Each of M8, M9, M10 is a PMOS transistor, and each of M11, M12, and M13 is an NMOS transistor.

Switch SW3 is coupled between a first power terminal (to receive $V_{CC\_C}$ voltage, such as 2.5V) and the buffer circuitry 1902, and switch SW6 is coupled between a second power terminal (to receive $V_{EE\_C}$ voltage, such as −1V) and the buffer circuitry 1902. Both switches SW3 and SW6 are optional, and can be controlled to disconnect the buffer circuitry 1902 from the first and second power terminals when the buffer output is not used to reduce power. The buffer circuitry 1902 has a first switch terminal, a second switch terminal, an input terminal, first, second, third, fourth, fifth, and sixth bias terminals, a buffer output, a first level shift output, and a second level shift output. The first switch terminal is coupled to the switch SW3, which has a control terminal to receive the control signal Φ. The second switch terminal is coupled to the switch SW6, which has a control terminal to receive the control signal Φ. The input terminal is to receive a VIN voltage. The first bias terminal is to receive a first bias voltage $V_{BN1}$. The second bias terminal is to receive a second bias voltage $V_{BN2}$. The third bias terminal is to receive a third bias voltage $V_{BN3}$. The fourth bias terminal is to receive a fourth bias voltage $V_{BP1}$. The fifth bias terminal is to receive a fifth bias voltage $V_{BP2}$. The sixth bias terminal is to receive a sixth bias voltage $V_{BP3}$.

The buffer circuitry 1902 includes transistors M8, M9, and M10 coupled in series between the first switch terminal and the buffer output, and transistors M11, M12, and M13 coupled in series between the buffer output and the second switch terminal. M8 is coupled between the first switch terminal and the first level shift output, and M13 is coupled between the second switch terminal and the second level shift output. The buffer circuitry 1902 can have a push-pull source follower configuration, where each of transistors M8, M9, M10, M11, M12, and M13 includes a source follower and is driven by a level shifted version of VIN. As described above, a push-pull source follower can provide improved power efficiency.

The buffer circuitry 1902 also includes level shifter circuitry 1906 to provide the level shifted version of VIN to each of transistors M8, M9, M10, M11, M12, and M13. The level shifter circuitry 1906 includes a level shift input, the first, second, third, fourth, fifth, and sixth bias terminals, and first, second, third, fourth, fifth, and sixth level shift outputs. Level shift input is coupled to the input terminal of buffer circuitry 1902 to receive VIN.

Specifically, level shifter circuitry 1906 includes a first level shifter including capacitor C7 and resistor R4, where capacitor C7 is coupled between level shift input and the control terminal of M8, and resistor R4 is coupled between the first bias terminal (to receive $V_{BN1}$) and the first level shift output, which is coupled to control terminal of M8, to provide a level shifted version of VIN to M8. Level shifter circuitry 1906 also includes a second level shifter including capacitor C8 and resistor R8, where capacitor C8 is coupled between level shift input and the control terminal of M13, and resistor R8 is coupled between the fourth bias terminal (to receive $V_{BP1}$) and a second level shift output, which is coupled to the control terminal of M13, to provide a level shifted version of VIN to M13.

Also, level shifter circuitry 1906 includes transistors M14, M15, M16, and M17 each configured as a common gate level shifter. A first side of resistor R6 is to the input terminal/level shift input. Transistor M15 is coupled between a second side of resistor R6 and the third level shift output, where the third level shift output is coupled to the control terminal of transistor M10, to provide a level shifted version of VIN to M10. The control terminal of M15 is coupled to the third bias terminal to receive $V_{BN3}$. Transistor M14 is coupled between the third level shift output and the fourth level shift output, where the fourth level shift output is coupled to the control terminal of M9, to provide a level shifted version of VIN to M9. The control terminal of M14 is coupled to the second bias terminal to receive $V_{BN2}$. Further, transistor M16 is coupled between the second side of resistor R6 and the fifth level shift output, where the fifth level shift output is coupled to the control terminal of transistor M11, to provide a level shifted version of VIN to M11. The control terminal of M16 is coupled to the sixth bias terminal to receive $V_{BP3}$. Transistor M17 is coupled between the fifth level shift output and the sixth level shift output, where the sixth level shift output is coupled to the control terminal of M12, to provide a level shifted version of VIN to M12. The control terminal of M17 is coupled to the fifth bias terminal to receive $V_{BP2}$.

The switch SW5 is coupled between the first power supply terminal and the first switch terminal, and the switch SW6 is coupled between the second switch terminal and the second power supply terminal. The switches can disconnect the buffer circuitry from power when the buffer voltage $V_{IB}$ is not used by the downstream circuit (e.g., during the hold phase, or where VIN is not selected), which can reduce power. Specifically, when the control signal Φ has a high state (e.g., the buffer output being selected, or during a sampling phase), SW5 connects the buffer circuitry 1902 to the first power terminal, and SW6 connects the buffer circuitry 1902 to the second power terminal. The buffer circuitry 1902 can provide $V_{IB}$ at the buffer output as a level shifted and buffered version of VIN, $V_{LN}$ at the first level shift output as a level shifted and buffered version of VIN, and $V_{LP}$ at the second level shift output as a level shifted and buffered version of VIN. When the control signal Φ has a low state (e.g., the buffer output not being selected, or during a hold phase), SW5 and SW6 can disconnect the buffer circuitry 1902 from the first and second power terminals to reduce power.

Also, switch SW4 is coupled between the first level shift output (to receive $V_{LN}$) and a first control output, and switch SW5 is coupled between the first control output and a ground. The control terminal of switch SW4 receives the control signal Φ, and the control terminal of switch SW5 receives the control signal t. The first control output can provide control signal $\Phi_{BSTN}$. Also, switch SW7 is coupled between the second level shift output (to receive $V_{LP}$) and a second control output, and switch SW8 is coupled between the second control output and a third power terminal (which receives $V_{DD}$ voltage). The control terminal of switch SW7 receives the control signal $\overline{\Phi}$, and the control terminal of switch SW5 receives the control signal Φ. The second control output can provide control signal $\Phi_{BSTP}$.

Switches SW4 and SW5 can be configured to represent, for example, transistors M3A, M4A, M5A, M6A, and M7A of FIG. 10 to set a state of control signal $\Phi_{BSTN}$ at either VIN+$V_{DD}$ (when Φ is high) or at 0V (when Φ is low). Also, switches SW7 and SW8 can be configured to represent, for example, transistors M3B, M4B, M5B, M6B, and M7B of FIG. 10 to set a state of control signal $\Phi_{BSTP}$ at either VIN−$V_{DD}$ (when Φ is high) or at $V_{DD}$ (when Φ is low.

FIGS. 20, 21A, 21B, 22A, and 22B are graphs representing properties of heterogenous and integrated buffer circuitry and bootstrapped switch as described herein. FIG. 20 illustrates graphs 2002 and 2004. Graph 2002 represents an example relationship between output power and input frequency for a first S/H circuit having heterogenous buffer circuitry and bootstrapped switch as described herein (e.g., SiGe buffer circuitry and CMOS bootstrapped switch of FIGS. 8, 9, and 10). Graph 2004 represents another example relationship between output power an input frequency for a second S/H circuit having integrated buffer circuitry and bootstrapped switch as described herein (e.g., CMOS buffer circuitry and bootstrapped switch of FIGS. 15 and 16). As shown in FIG. 20, with the heterogenous buffer circuitry and bootstrapped switch, the 3 dB frequency is at 25 GHz, and with integrated buffer circuitry and bootstrapped switch, the 3 dB frequency is at 23 GHz. The bandwidth improvement of the heterogenous buffer circuitry and bootstrapped switch can be attributed to the SiGe buffer circuitry, which can provide improved bandwidth over the CMOS buffer circuitry.

Figure 21A:
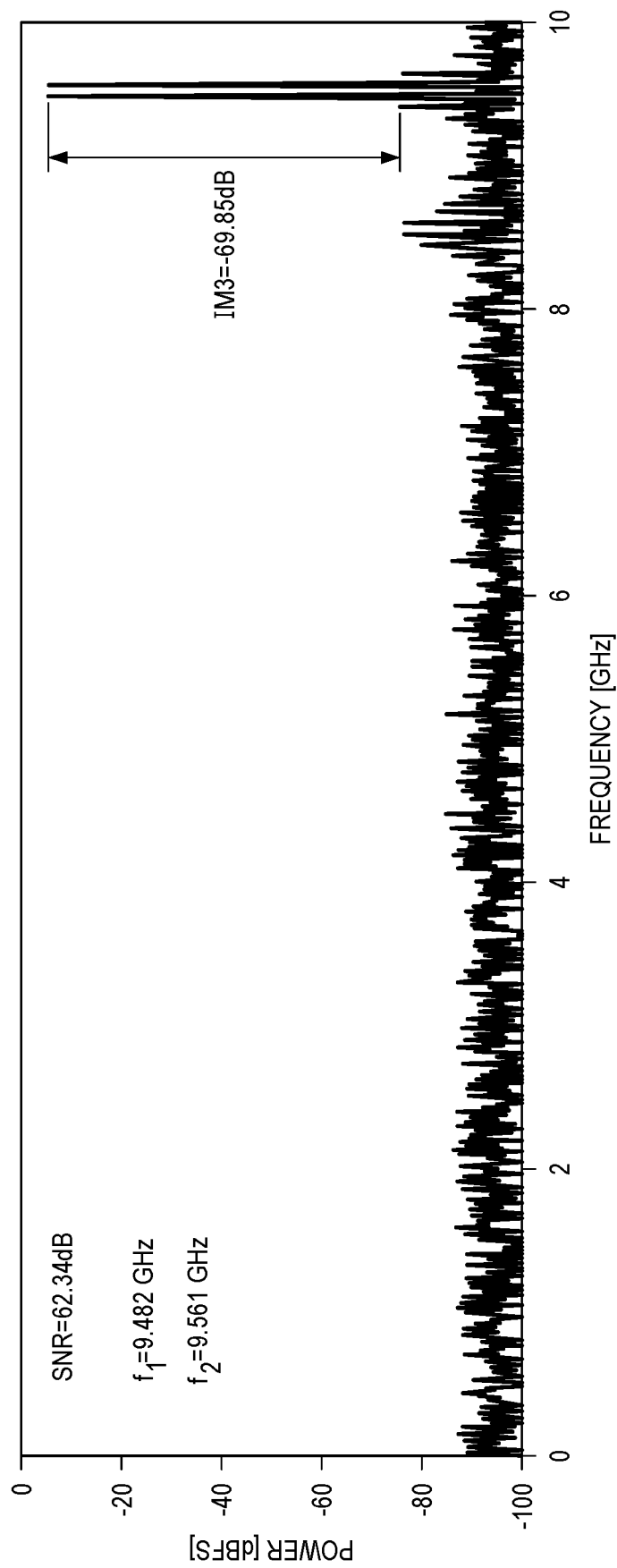
Figure 21B:
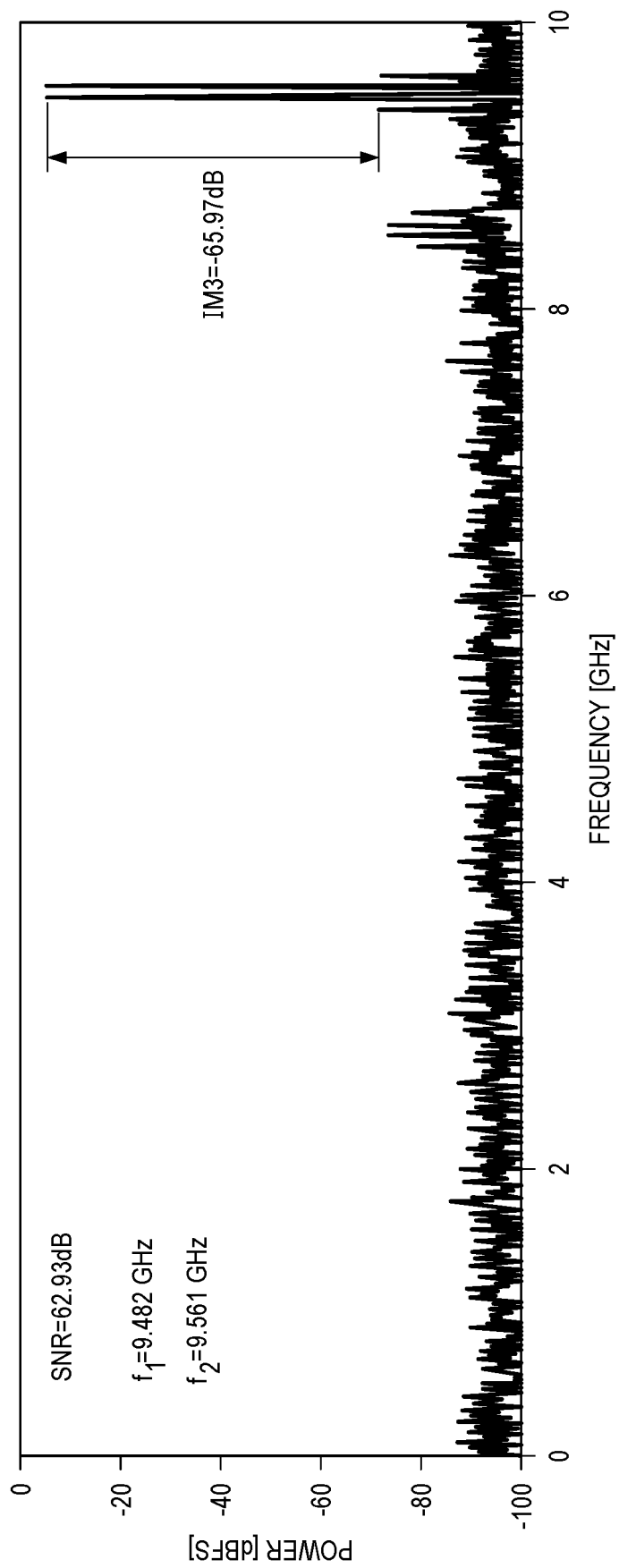

Also, FIG. 21A and FIG. 21B includes respectively graphs 2100 and 2110. Graph 2100 illustrates an example output power spectrum of a heterogenous buffer circuitry and bootstrapped switch described herein, and graph 2110 illustrates an example output power spectrum of an integrated buffer circuitry and bootstrapped switch described herein, both at input frequencies of 9.482 GHz and 9.561 GHz and with sampling rate at 20 giga-samples (GS)/s. As shown in graphs 2100 and 2110, the heterogenous buffer circuitry and bootstrapped switch provides a third order intermodulation distortion (IM3) of about −69.9 dB, while the integrated buffer circuitry and bootstrapped switch provides an IM3 of about −66 dB, therefore the heterogenous buffer circuitry and bootstrapped switch provides about 4 dB improvement in IM3. The improvement in IM3, which represents improved linearity, can be attributed to the superior linearity of SiGe buffer circuitry over CMOS buffer circuitry. Also, both heterogenous and integrated buffer circuitry and bootstrapped switch provide similar signal-to-noise ratios between 62-63 dB.

Figure 22A:
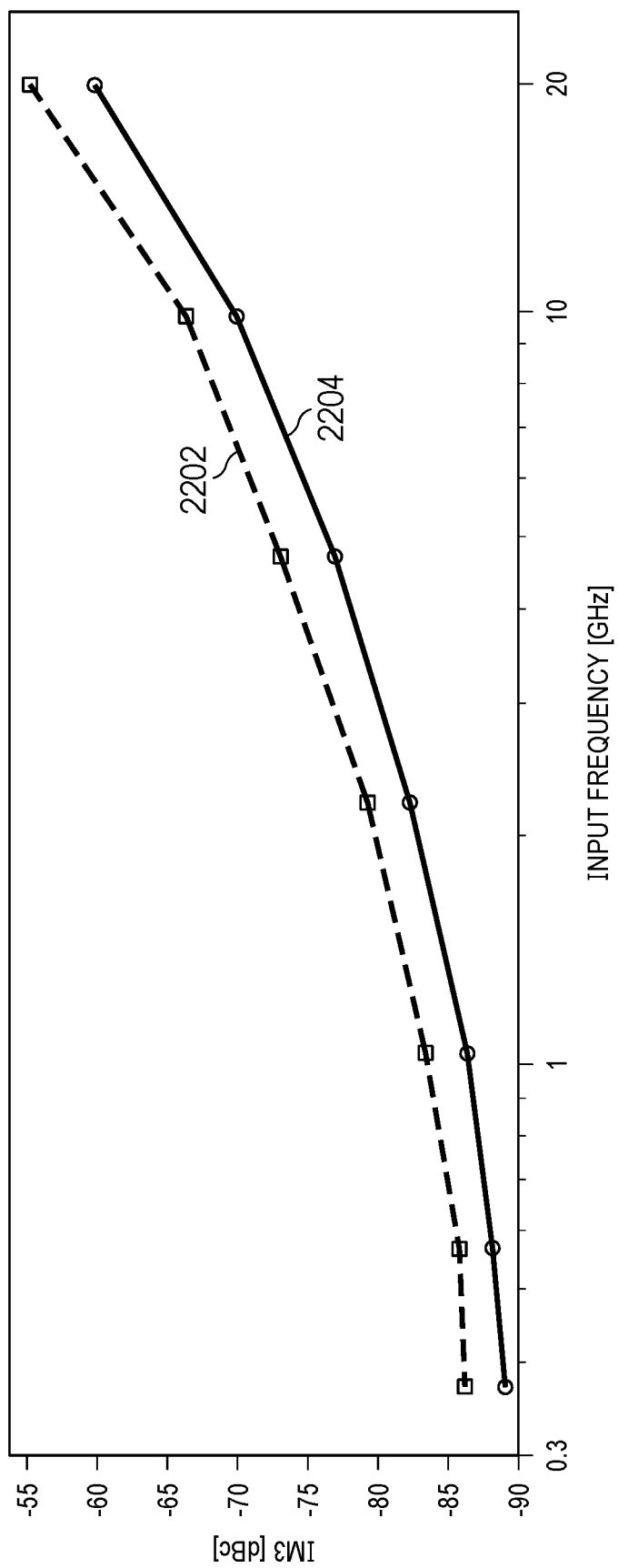
Figure 22B:
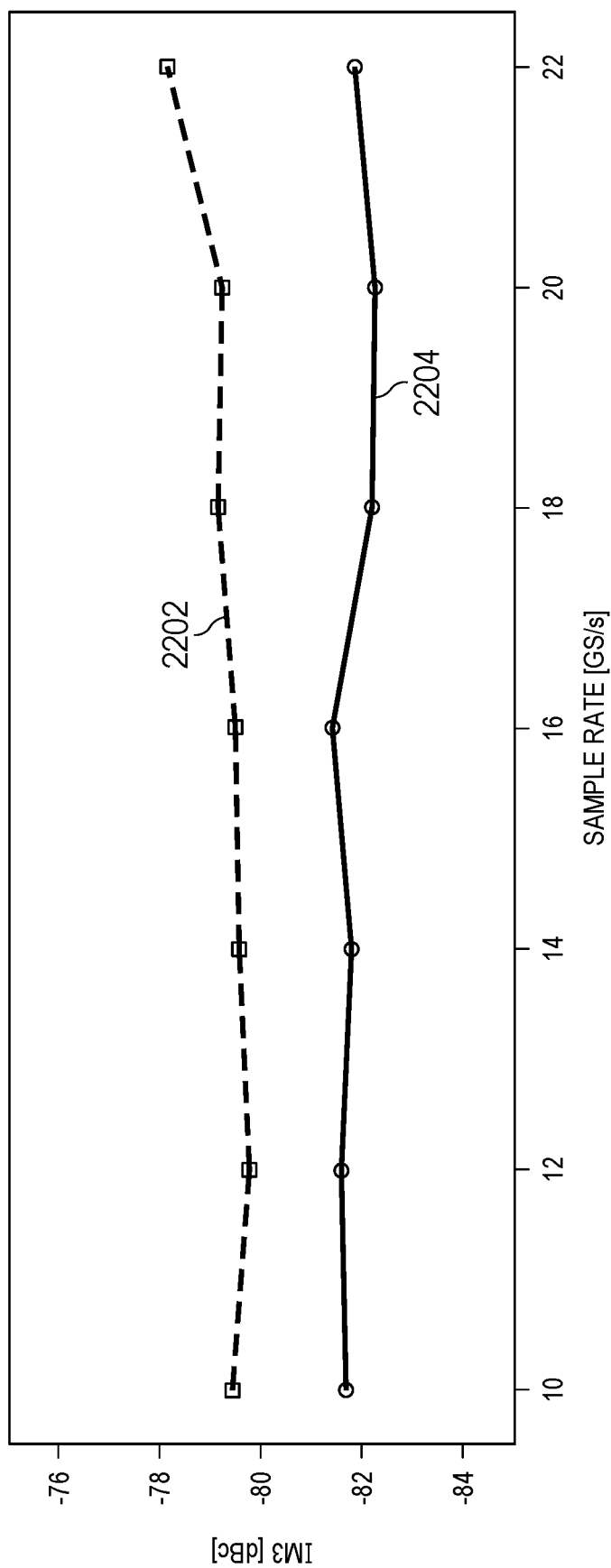

Similar linearity improvements are also shown in FIGS. 22A and 22B. Specifically, FIG. 22A includes graphs 2202 and 2204. Graph 2202 illustrates an example relationship between IM3 at the output of a heterogenous buffer circuitry and bootstrapped switch with respect to input frequency, and graph 2204 illustrates an example relationship between IM3 at the output of an integrated buffer circuitry and bootstrapped switch with respect to input frequency, both with a sampling rate of 20 GS/s. Also, FIG. 22B includes graphs 2212 and 2214. Graph 2212 illustrates an example relationship between IM3 at the output of a heterogenous buffer circuitry and bootstrapped switch with respect to sampling rate, and graph 2214 illustrates an example relationship between IM3 at the output of an integrated buffer circuitry and bootstrapped switch with respect to sampling rate, both with an input frequency of 2 GHz. In both FIGS. 22A and 22B, the heterogenous buffer circuitry and bootstrapped switch provides reduced IM3 compared with the integrated buffer circuitry and bootstrapped switch.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device.

For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a field effect transistor ("FET") such as an NFET or a PFET, a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control terminal and its first and second terminals. In the context of a FET, the control terminal is the gate, and the first and second terminals are the drain and source. In the context of a BJT, the control terminal is the base, and the first and second terminals are the collector and emitter.

References herein to a FET being "ON" means that the conduction channel of the FET is present and drain current may flow through the FET. References herein to a FET being "OFF" means that the conduction channel is not present so drain current does not flow through the FET. An "OFF" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described examples, and other examples are possible, within the scope of the claims.

What is claimed is:

1. An apparatus comprising:
    a transistor having a control terminal and a current terminal; and
    level shifter circuitry having a level shifter input and a level shifter output, the level shifter input coupled to the current terminal, and the level shifter output coupled to the control terminal, the level shifter circuitry configurable to provide a first voltage at the control terminal based on level-shifting a second voltage at the current terminal.

2. The apparatus of claim 1, wherein the level shifter circuitry has a bias input and includes:
    a capacitor coupled between the level shifter input and the level shifter output; and
    a resistor coupled between the bias input and the level shifter output.

3. The apparatus of claim 1, wherein current terminal is a first current terminal, the transistor is a first transistor, the control terminal is a first control terminal, and the level shifter circuitry includes a second transistor having a second control terminal and a second current terminal, the second current terminal of the second transistor coupled to the level shifter output.

4. The apparatus of claim 3, wherein the second control terminal is coupled to the level shifter input.

5. The apparatus of claim 3, wherein the level shifter circuitry has a bias input coupled to the second control terminal, and the second transistor is coupled between the level shifter input and the level shifter output.

6. The apparatus of claim 3, wherein the second transistor is a field effect transistor (FET) or a bipolar junction transistor (BJT).

7. The apparatus of claim 1, further comprising buffer circuitry having a buffer input and a buffer output, wherein the current terminal is a first current terminal coupled to the buffer output, the transistor has a second current terminal, and the level shifter input is coupled to one of the buffer input or the buffer output.

8. The apparatus of claim 7, further comprising a control circuit having a first control input, a second control input, a third control input, and a control output, the third control input coupled to a reference terminal, the first control input coupled to the level shifter output, and the control output coupled to the control terminal.

9. The apparatus of claim 8, wherein the control circuit is configurable to:
    responsive to a control signal at the second control input having a first state, connect the level shifter output to the control output; and
    responsive to the control signal at the second control input having a second state, connect the reference terminal to the control output.

10. The apparatus of claim 8, further comprising a capacitor coupled to the second current terminal.

11. The apparatus of claim 10, wherein the capacitor is coupled between the second current terminal and an output.

12. The apparatus of claim 8, wherein the second control input is coupled to a clock generator.

13. The apparatus of claim 8, wherein the second control input is coupled to a selection signal generator.

14. The apparatus of claim 8, further comprising an integrated circuit including a first semiconductor die and a second semiconductor die, the first semiconductor die including the buffer circuitry, and the second semiconductor die including the control circuit and the transistor.

15. The apparatus of claim 14, wherein the first semiconductor die includes a silicon germanium (SiGe) bipolar die, and the second semiconductor die includes a complementary metal-oxide semiconductor (CMOS) die.

16. The apparatus of claim 7, wherein the transistor is a first transistor, the control terminal is a first control terminal, the buffer output is a first buffer output, the buffer circuitry has a first power terminal, a second power terminal, a bias terminal, and a second buffer output, and the buffer circuitry includes:
   a second transistor coupled between the first power terminal and the second buffer output, the second transistor having a second control terminal;
   a third transistor coupled between the second buffer output and the first buffer output, the third transistor having a third control terminal coupled to the buffer input; and
   a fourth transistor coupled between the first buffer output and the second power terminal, the fourth transistor having a fourth control terminal coupled to the bias terminal; and
   wherein the level shifter output is coupled to the second control terminal, and the second buffer output is coupled to the first control terminal.

17. The apparatus of claim 7, wherein:
   the level shifter output is a first level shifter output;
   the level shifter output has second, third, and fourth level shifter outputs;
   the transistor is a first transistor, and the control terminal is a first control terminal;
   the buffer output is a first buffer output;
   the apparatus further comprises a second transistor coupled between the first buffer output and the first current terminal, the second transistor having a second control terminal;
   the buffer circuitry has a first power terminal, a second power terminal, and second and third buffer outputs, and the buffer circuitry includes:
      a third transistor coupled between the first power terminal and the second buffer output, the third transistor having a third control terminal coupled to the first level shifter output;
      a fourth transistor coupled between the second buffer output and the first buffer output, the fourth transistor having a fourth control terminal coupled to the second level shifter output;
      a fifth transistor coupled between the first buffer output and the third buffer output, the fifth transistor having a fifth control terminal coupled to the third level shifter output; and
      a sixth transistor coupled between the third buffer output and the second power terminal, the sixth transistor having a sixth control terminal coupled to the fourth level shifter output; and
   the first control terminal is coupled to the second buffer output, and the second control terminal is coupled to the third buffer output.

18. The apparatus of claim 7, further comprising a semiconductor die including the buffer circuitry and the transistor.

19. The apparatus of claim 18, wherein the semiconductor die is a bipolar complementary metal-oxide semiconductor (BiCMOS) die.

20. An apparatus comprising:
   buffer circuitry having a buffer input and a buffer output;
   a transistor coupled between the buffer output and a current terminal, the transistor having a control terminal; and
   level shifter circuitry having a level shifter input and a level shifter output, the level shifter input coupled to one of the buffer input or the buffer output, and the level shifter output coupled to the control terminal.

21. The apparatus of claim 20, wherein the level shifter circuitry has a bias input and includes:
   a capacitor coupled between the level shifter input and the level shifter output; and
   a resistor coupled between the bias input and the level shifter output.

22. The apparatus of claim 20, wherein the current terminal is a first current terminal, the transistor is a first transistor, the control terminal is a first control terminal, and the level shifter circuitry has a bias input and includes a second transistor having a second control terminal and a second current terminal, the second current terminal of the second transistor coupled to the level shifter output.

23. The apparatus of claim 20, further comprising a control circuit having a first control input, a second control input, a third control input, and a control output, the third control input coupled to a reference terminal, the first control input coupled to the level shifter output, and the control output coupled to the control terminal.

24. The apparatus of claim 23, wherein the control circuit is configurable to:
   responsive to a control signal at the second control input having a first state, connect the level shifter output to the control output; and
   responsive to the control signal at the second control input having a second state, connect the reference terminal to the control output.

* * * * *